(12) United States Patent
Mao et al.

(10) Patent No.: US 8,854,712 B2
(45) Date of Patent: Oct. 7, 2014

(54) DISPLAY DEVICE PROVIDED WITH MEMS LIGHT VALVE AND FORMING METHOD THEREOF

(75) Inventors: Jianhong Mao, Shanghai (CN); Deming Tang, Shanghai (CN)

(73) Assignee: Lexvu Opto Microelectronics Technology (Shanghai) Ltd, Shanghai (CN)

( * ) Notice: Subject to any disclaimer, the term of this patent is extended or adjusted under 35 U.S.C. 154(b) by 0 days.

(21) Appl. No.: 14/112,165

(22) PCT Filed: Dec. 29, 2011

(86) PCT No.: PCT/CN2011/084900
§ 371 (c)(1),
(2), (4) Date: Oct. 16, 2013

(87) PCT Pub. No.: WO2012/142849
PCT Pub. Date: Oct. 26, 2012

(65) Prior Publication Data
US 2014/0029077 A1 Jan. 30, 2014

(30) Foreign Application Priority Data

Apr. 18, 2011 (CN) .......................... 2011 1 0097096

(51) Int. Cl.
G02B 26/00 (2006.01)
G02B 26/02 (2006.01)
G02B 26/08 (2006.01)
G02B 26/04 (2006.01)
G09G 3/34 (2006.01)
H04M 1/00 (2006.01)
H01L 29/66 (2006.01)

(52) U.S. Cl.
CPC ............ *G02B 26/02* (2013.01); *G02B 26/0841* (2013.01); *G02B 26/04* (2013.01); *G09G 3/3433* (2013.01); *G09G 3/34* (2013.01); *H04M 1/00* (2013.01); *H01L 29/66742* (2013.01)
USPC ............................ 359/230; 359/227; 359/290

(58) Field of Classification Search
USPC ............. 359/227–236, 573; 438/32; 396/235, 396/246, 355, 357, 449, 452–453, 461, 396/483–490, 493, 498; 353/39, 98–99
See application file for complete search history.

(56) References Cited

U.S. PATENT DOCUMENTS 6,288,824 B1 * 9/2001 Kastalsky ..................... 359/254
7,271,945 B2 9/2007 Hagood et al.
2003/0035193 A1 * 2/2003 Islam et al. ................... 359/290

(Continued)

FOREIGN PATENT DOCUMENTS

CN 2251148 Y 4/1997
CN 101240887 A 8/2008

(Continued)

OTHER PUBLICATIONS

International Search Report (in Chinese with English translation) and Written Opinion (in Chinese) for PCT/CN2011/084900, mailed Mar. 22, 2012; ISA/CN.

*Primary Examiner* — Ricky Mack
*Assistant Examiner* — William Alexander
(74) *Attorney, Agent, or Firm* — Harness, Dickey & Pierce, P.L.C.

(57) ABSTRACT

A display device provided with an MEMS light valve, comprising: a substrate, a fixed optical grating located on the substrate, an MEMS light valve for controlling the opening and closing of the fixed optical grating, the MEMS light valve comprises a first light valve and a second light valve; the opening and closing of the fixed optical grating is controlled via controlling the movement of the first light valve and the second light valve, and the moving directions of the first light valve and the second light valve are opposite. Also disclosed is a method for forming a display device provided with an MEMS light valve. Thus the sensitivity of the MEMS light valve is improved.

19 Claims, 15 Drawing Sheets

(56) References Cited

U.S. PATENT DOCUMENTS

2006/0146392 A1* 7/2006 An et al. .................. 359/291
2009/0244678 A1* 10/2009 Hagood et al. ............ 359/230
2011/0032246 A1* 2/2011 Hong et al. ............... 345/214
2012/0154455 A1* 6/2012 Steyn et al. .............. 345/690

FOREIGN PATENT DOCUMENTS

| | | |
|---|---|---|
| CN | 101567554 A | 10/2009 |
| CN | 202057883 U | 11/2011 |
| CN | 102279463 A | 12/2011 |
| CN | 102279463 B | 10/2013 |

\* cited by examiner

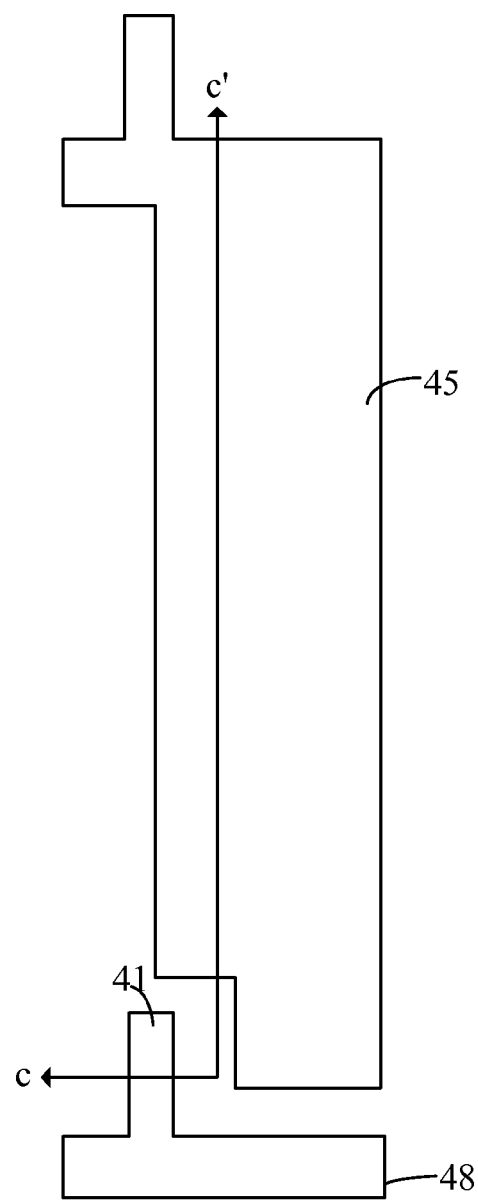
FIG. 8a₁
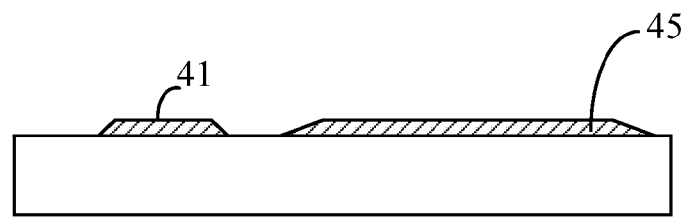
FIG. 8a₂

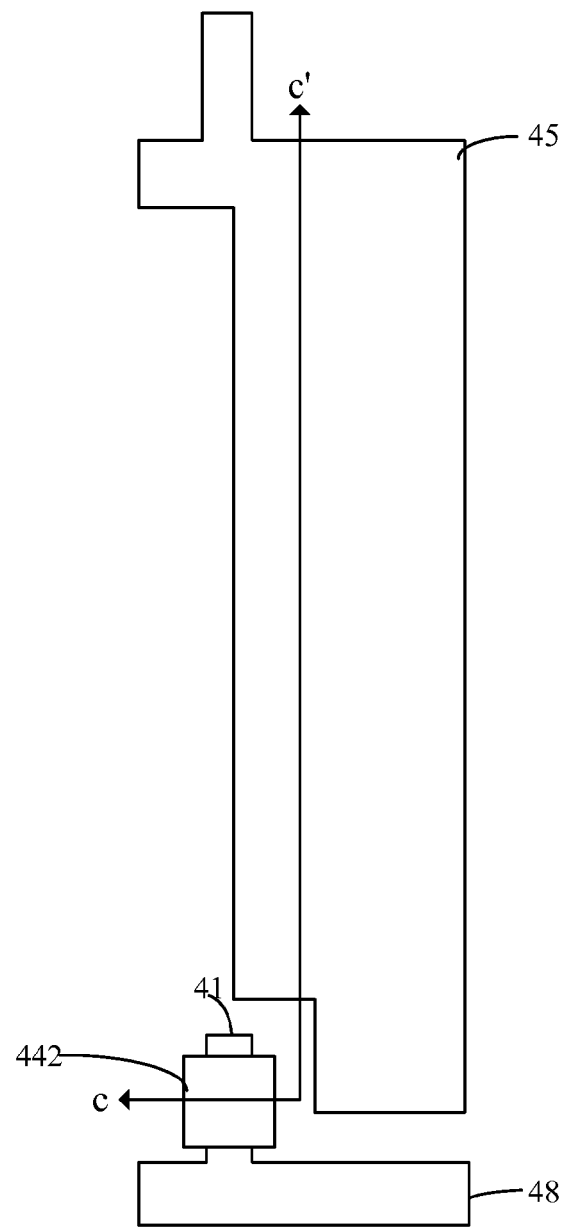
FIG. 8b$_1$
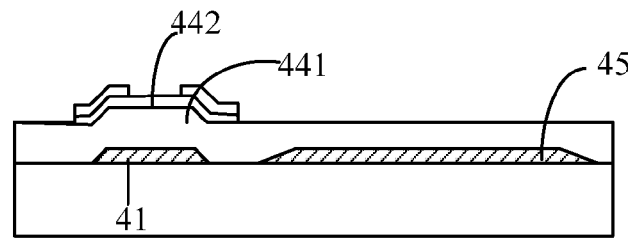
FIG. 8b$_2$

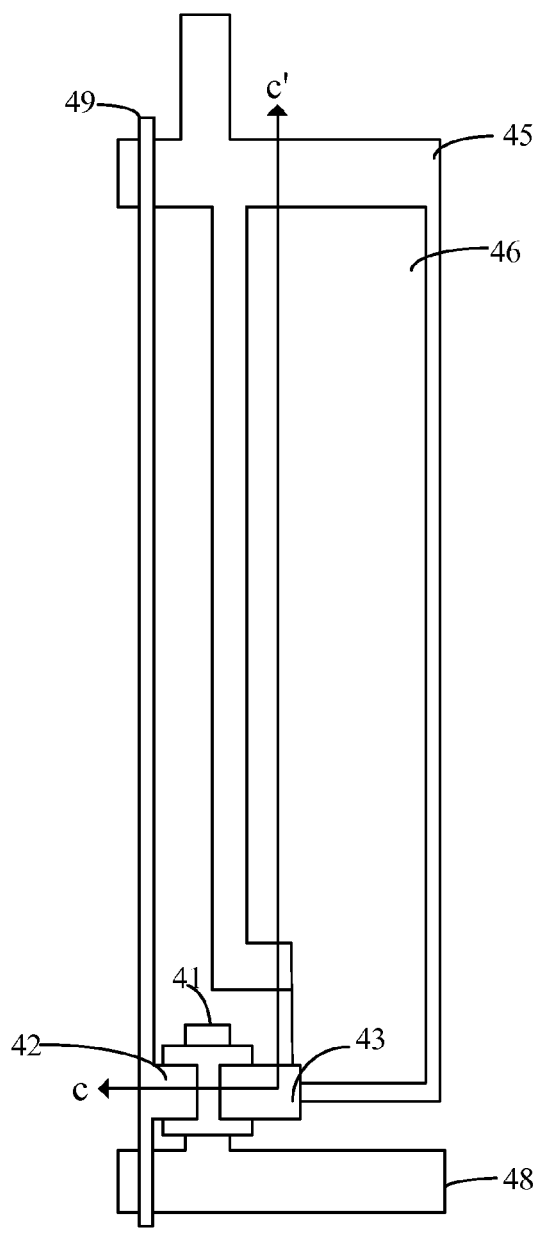
FIG. 8c₁
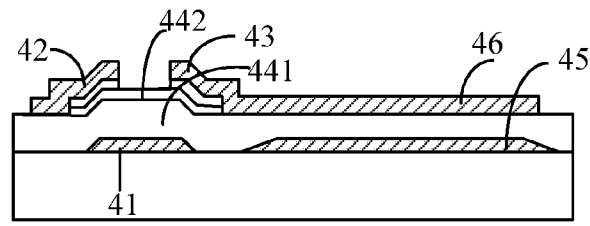
FIG. 8c₂

DISPLAY DEVICE PROVIDED WITH MEMS LIGHT VALVE AND FORMING METHOD THEREOF

CROSS-REFERENCE TO RELATED APPLICATIONS

This application is a 371 U.S. National Stage of International Application No. PCT/CN2011/084900, filed Dec. 29, 2011, and claims priority to Chinese Patent Application No. 201110097096.4, filed on Apr. 18, 2011, and entitled "Display Device Provided with MEMS Light Valve and Forming Method thereof," the disclosures of which are herein incorporated by reference in their entirety.

FIELD OF THE DISCLOSURE

The present disclosure generally relates to display technology, and more particularly, to a display device provided with a micro-electromechanical system (MEMS) light valve and a forming method thereof.

BACKGROUND OF THE DISCLOSURE

Recently, demands for various display devices are increasing, along with the rapid development of communication technology. There are several kinds of display devices commonly used, including: cathode-ray tube (CRT) display, liquid crystal display (LCD), plasma display panel (PDP), electro luminescence display (ELD), vacuum fluorescence display (VFD), and the like. LCD devices, due to their characteristics like light, thin, small size, low power consumption, less radiation, and the like, are widely used in various data processing devices, such as television, laptop, mobile phone, personal data assistant, and so on.

A LCD device may mainly include following components. A substrate is provided, in which a backlight source is disposed. A pixel electrode and a thin film transistor (TFT) array are disposed on the substrate. The TFT array is electrically coupled to the pixel electrode and is used to control the electric potential of the pixel electrode. The LCD device further includes a color filter plate, and a liquid crystal layer between the pixel electrode and the color filter plate. On a surface of the color filter plate which is facing the liquid crystal layer, there is provided with a common electrode layer. Electric potential is applied to the pixel electrode through the TFT array, such that an electric potential difference exists between the common electrode layer and the pixel electrode. Liquid crystal molecules in the liquid crystal layer may deflect to certain angles depending on magnitudes of the electric potential difference. Therefore, the amount of light, which is emitted from the backlight source, passes through the liquid crystal layer and arrives at the color filter plate, can be controllable. The backlight used in the LCD device is white light. Since only polarized light can pass through the liquid crystal layer, nearly 50% of the light may be wasted. When the light is passing through the color filter plate, the upmost usage of the light may be only 33%. As a result, light usage in conventional LCD devices may be relatively low. Further, conventional LCD devices may have other drawbacks, such as narrow view angle coverage, complex construction, high cost, and the like.

Along with the development of micro-electromechanical system (MEMS) technology, MEMS light valves are tending to be used in display devices to replace liquid crystal layers. Luminousness of backlight may be controlled by using the MEMS light valves. TFT-MEMS can be integrated into current TFT-LCD panel micro manufacturing technologies. Using the MEMS, which have the advantages of high speed and high efficiency, to replace liquid crystal, there is no longer need for polaroids, color filter plates or indium tin oxide (ITO) electrodes. Therefore, light usage may be greatly increased, power consumption and manufacturing costs may be reduced.

A display device having a MEMS light valve is disclosed in US Publication No. U.S. Pat. No. 7,271,945B2 which is published on Sep. 18, 2007. However, the MEMS light valve has disadvantages like complex structure and low sensitivity.

SUMMARY

Embodiments in the present disclosure provide display devices having a micro-electromechanical system (MEMS) valve with improved sensitivity.

According to one embodiment, a display device with a MEMS light valve is provided, the display device includes:
a substrate; and
a fixed optical grating and a MEMS light valve above the substrate, wherein the MEMS light valve is used to control the fixed optical grating to open or close,
wherein the MEMS light valve includes a first light valve and a second light valve, the first light valve is formed on the second light valve, the fixed optical grating is configured to be opened or closed by controlling movements of the first light valve and the second light valve, and movement directions of the first light valve and the second light valve are opposite.

Optionally, the first light valve includes: a first movable optical grating, a first electrode and a second electrode,
wherein the first movable optical grating is fixed to and electrically coupled with the first electrode which is disposed correspondingly with the second electrode, a capacitor is formed between the first electrode and the second electrode, when an electric potential difference exists between the first electrode and the second electrode, the first electrode is configured to drive the first movable optical grating to move, a fixed end is provided on a side of the first movable optical grating, which side is opposite to a side on which the first electrode is located, the first movable optical grating is fixed by the fixed end, when there is no electric potential difference existing between the first electrode and the second electrode, the fixed end of the first movable optical grating is configured to drive the first movable optical grating to return to an original position.

Optionally, the second light valve includes: a second movable optical grating, a third electrode and a fourth electrode, wherein the third electrode and the fourth electrode are disposed on a side of the second movable optical grating, which side is opposite to a side on which the first electrode and the second electrode are located,
wherein the second movable optical grating is fixed to and electrically coupled with the third electrode which is disposed correspondingly with the fourth electrode, a capacitor is formed between the third electrode and the fourth electrode, when an electric potential difference exists between the third electrode and the fourth electrode, the third electrode is configured to drive the second movable optical grating to move, a fixed end is provided on a side of the second movable optical grating, which side is opposite to a side where the third electrode is located, the second movable optical grating is fixed by the fixed end of the second movable optical grating, when there is no electric potential difference existing between the third electrode and the fourth electrode, the fixed end of the second movable optical grating is configured to drive the second movable optical grating to return to an original position.

Optionally, the fixed optical grating has a rectangle shape with a top side, a bottom side and two lateral sides;

wherein each of the first movable optical grating and the second movable optical grating has a rectangle shape with a first side, a second side, a third side and a fourth side, the first side is opposite to the third side, the second side is opposite to the fourth side, the first side is corresponding to the top side of the fixed optical grating, the third side is corresponding to the bottom side of the fixed optical grating, and the second side and the fourth side are respectively corresponding to the two lateral sides of the fixed optical grating;

wherein the first electrode and the second electrode are disposed on a side where the second side of the first movable optical grating locates, the fixed end of the first movable optical grating is disposed on the fourth side of the first movable optical grating; and wherein the third electrode and the fourth electrode are disposed on a side where the fourth side of the second movable optical grating locates, the fixed end of the second movable optical grating is disposed on a side where the second side of the second movable optical grating locates.

Optionally, the first light valve further includes two first fixed plates which are disposed on a side where the fourth side of the first movable optical grating locates and fixed to the first movable optical grating, the first fixed plates are symmetrically disposed on a side where the fourth side of the first movable optical grating locates and respectively extend beyond the first side and the third side of the first movable optical grating, the fixed end of the first movable optical grating is at an end of each of the first fixed plates which is apart from the first movable optical grating; and the second light valve further includes two second fixed plates which are disposed on a side where the second side of the second movable optical grating locates and fixed to the second movable optical grating, the second fixed plates are symmetrically disposed on a side where the second side of the second movable optical grating locates and respectively extend beyond the first side and the third side of the second movable optical grating, the fixed end of the second movable optical grating is at an end of each of the second fixed plates which is apart from the second movable optical grating.

Optionally, the first electrode includes a first plate and a second plate, the first plate and the second plate are connected with the first movable optical grating and symmetrically disposed, ends of the first plate and the second plate which are apart from the first movable optical grating are first fixed ends, and the first electrode is fixed by the first fixed ends; and the second electrode includes a third plate and a fourth plate, the third plate is opposite to the first plate of the first electrode, the fourth plate is opposite to the second plate of the first electrode, a second fixed end is provided between the third plate and the fourth plate, the second fixed end connects the third plate with the fourth plate, the second electrode is fixed by the second fixed end, a distance between each of two lateral ends of the second electrode and the first electrode is less than a distance between the second fixed end and the first electrode.

Optionally, the third electrode includes a first plate and a second plate, the first plate and the second plate are connected with the second movable optical grating and symmetrically disposed, ends of the first plate and the second plate which are apart from the second movable optical grating are third fixed ends, and the third electrode is fixed by the third fixed ends; and the fourth electrode includes a third plate and a fourth plate, the third plate is opposite to the first plate of the third electrode, the fourth plate is opposite to the second plate of the third electrode, a fourth fixed end is provided between the third plate and the fourth plate, the fourth fixed end connects the third plate with the fourth plate, the fourth electrode is fixed by the fourth fixed end, a distance between each of two lateral ends of the fourth electrode and the third electrode is less than a distance between the fourth fixed end and the third electrode.

Optionally, each of the first movable optical grating and the second movable optical grating includes a plurality of strip-shaped nonopaque openings, the strip-shaped nonopaque openings of the first movable optical grating and the second movable optical grating are parallel with the second sides of the first movable optical grating and the second movable optical grating, respectively.

Optionally, the fixed optical grating is circular and includes a plurality of fan-shaped nonopaque openings, and each of the first movable optical grating and the second movable optical grating is circular and includes a plurality of fan-shaped nonopaque openings;

wherein the first electrode, the second electrode and the fixed end of the first movable optical grating are disposed on a circumference edge of the first movable optical grating; and wherein the third electrode, the fourth electrode and the fixed end of the second movable optical grating are disposed on a circumference edge of the second movable optical grating.

Optionally, the first electrode includes a first plate which is connected to the circumference edge of the first movable optical grating, an end of the first plate which is apart from the first movable optical grating is a first fixed end, and the first electrode is fixed by the first fixed end;

the second electrode includes a second plate which is opposite to the first plate of the first electrode, the second plate includes a second fixed end, the second electrode is fixed by the second fixed end, a distance between an end of the second plate which is apart from the second fixed end and the first electrode is less than a distance between the second fixed end and the first electrode;

the third electrode includes a third plate which is connected to the circumference edge of the second movable optical grating, an end of the third plate which is apart from the second movable optical grating is a third fixed end, and the third electrode is fixed by the third fixed end; and the fourth electrode includes a fourth plate which is opposite to the third plate of the third electrode, the fourth plate includes a fourth fixed end, the fourth electrode is fixed by the fourth fixed end, a distance between an end of the fourth plate which is apart from the fourth fixed end and the third electrode is less than a distance between the fourth fixed end and the third electrode.

Optionally, the first light valve further includes a first fixed plate which is disposed on the circumference edge of the circular first movable optical grating and fixed to the first movable optical grating, the fixed end of the first movable optical grating is disposed at an end of the first fixed plate which is apart from the first movable optical grating; and the second light valve further includes a second fixed plate which is disposed on the circumference edge of the circular second movable optical grating and fixed to the second movable optical grating, the fixed end of the second movable optical grating is disposed at an end of the second fixed plate which is apart from the second movable optical grating.

Optionally, the fixed optical grating is fan-shaped and includes a plurality of strip-shaped nonopaque openings, and each of the first movable optical grating and the second movable optical grating is fan-shaped and includes a plurality of strip-shaped nonopaque openings;

wherein the first electrode and the second electrode are disposed on a shorter arc side of the first movable optical grating, and the fixed end of the first movable optical grating is disposed on a longer arc side of the first movable optical grating; and wherein the third electrode and the fourth electrode are disposed on a shorter arc side of the second movable optical grating, and the fixed end of the second movable optical grating is disposed on a longer arc side of the second movable optical grating.

Optionally, the first electrode includes a first plate which is connected to the shorter arc side of the first movable optical grating, an end of the first plate which is apart from the first movable optical grating is a first fixed end, and the first electrode is fixed by the first fixed end;

the second electrode includes a second plate which is opposite to the first plate of the first electrode, the second plate includes a second fixed end, the second electrode is fixed by the second fixed end, a distance between an end of the second plate which is apart from the second fixed end and the first electrode is less than a distance between the second fixed end and the first electrode;

the third electrode includes a third plate which is connected to the shorter arc side of the second movable optical grating, an end of the third plate which is apart from the second movable optical grating is a third fixed end, and the third electrode is fixed by the third fixed end; and the fourth electrode includes a fourth plate which is opposite to the third plate of the third electrode, the fourth plate includes a fourth fixed end, the fourth electrode is fixed by the fourth fixed end, a distance between an end of the fourth plate which is apart from the fourth fixed end and the third electrode is less than a distance between the fourth fixed end and the third electrode.

Optionally, the first light valve further includes a first fixed plate which is disposed on the longer arc side of the first movable optical grating and fixed to the first movable optical grating, the fixed end of the first movable optical grating is disposed at an end of the first fixed plate which is apart from the first movable optical grating; and the second light valve further includes a second fixed plate which is disposed on the longer arc side of the second movable optical grating and fixed to the second movable optical grating, the fixed end of the second movable optical grating is disposed at an end of the second fixed plate which is apart from the second movable optical grating.

Optionally, the display device further includes a plurality of thin-film-transistor (TFT) switches on the substrate or the fixed optical grating, wherein the first, second, third and fourth electrodes are electrically coupled to the corresponding TFT switches, respectively.

Optionally, each of the TFT switches includes:

a gate, a source, a drain, a conductive channel for electrically coupling the source and the drain, a gate dielectric layer between the conductive channel and the gate, a source electrode electrically coupled to the source, a drain electrode electrically coupled to the drain, and a capacitor including a first electrode plate, a second electrode plate and a capacitor dielectric layer between the first electrode plate and the second electrode plate, wherein the first electrode plate and the gate are disposed in a same layer and include a same conductive material having a luminousness less than about 50%, wherein the second electrode plate, the source electrode and the drain electrode are in a same layer and include a same conductive material having a luminousness less than about 50%, the second electrode plate is electrically coupled to the source electrode or the drain electrode, and the second electrode plate is electrically coupled to any one of the first, second, third and fourth electrodes.

Optionally, the conductive channel includes a lightly doped silicon layer, a heavily doped silicon layer is provided between the lightly doped silicon and the gate dielectric layer, wherein the heavily doped silicon layer includes an opening which exposes the lightly doped silicon layer, and parts of the heavily doped silicon layer on two sides of the opening respectively constitute the source and the drain.

Optionally, the gate dielectric layer and the capacitor dielectric layer include a same material and are disposed in a same layer.

Optionally, each one of the first electrode plate, the second electrode plate, the gate, the source electrode and the drain electrode includes a metal material.

Optionally, each one of the first electrode plate, the second electrode plate, the gate, the source electrode and the drain electrode includes at least one material selected from a group consisting of Au, Ag, Cu, Al, Ti, Cr, Mo, Cd, Ni and Co.

Optionally, each one of the first electrode plate, the second electrode plate, the gate, the source electrode and the drain electrode includes at least one material selected from a group consisting of Au, Ag, Cu, Al, Ti, Cr, Mo, Cd, Ni, Co, amorphous silicon, polysilicon, amorphous SiGe, and polycrystalline SiGe.

Optionally, the TFT switches are low temperature polysilicon TFT (LTPS-TFT) switches.

Optionally, the display device further includes a cap layer and a sealing cap, wherein the cap layer encompasses the MEMS light valve from lateral sides of the MEMS light valve and covers a top of the MEMS light valve, the cap layer includes at least one opening on top of the cap layer, and the sealing cap seals the at least one opening.

Optionally, each one of the cap layer and the sealing cap includes at least one material selected from a group consisting of silicon oxide, silicon nitride, silicon carbide and silicon oxynitride.

Optionally, the fixed optical grating is formed on the substrate, the second light valve is formed on the fixed optical grating, and the first light valve is formed on the second light valve.

Optionally, the second light valve is formed on the substrate, the first light valve is formed on the second light valve, and the fixed optical grating is formed on the fixed optical grating.

According to one embodiment of the present disclosure, a method for forming a display device with a MEMS valve is provided. The method includes:

providing a substrate; and forming a fixed optical grating and a above described MEMS light valve above the substrate, wherein the MEMS light valve is formed on the fixed optical grating after the fixed optical grating is formed on the substrate, or else, the fixed optical grating is formed on the MEMS light valve after the MEMS light valve is formed on the substrate.

Optionally, a plurality of thin-film-transistor (TFT) switches are formed on the substrate or the fixed optical grating before the MEMS light valve is formed, wherein the fixed electrodes are electrically coupled to the TFT switches, respectively.

Optionally, forming each one of the TFT switches includes:

forming a first conductive layer on the substrate or the fixed optical grating, wherein the first conductive layer includes a conductive material having a luminousness less than about 50%;

patterning the first conductive layer to form a gate and a first electrode plate;

forming a first dielectric layer to cover the gate and the first electrode plate, wherein a part of the first dielectric layer on the first electrode plate constitutes a capacitor dielectric layer, and a part of the first dielectric layer on the gate constitutes a gate dielectric layer;

successively forming a light doped silicon layer and a heavily doped silicon layer on a part of the first dielectric layer which is on the gate, wherein the heavily doped silicon layer includes an opening which exposes the lightly doped silicon layer, two parts of the heavily doped silicon layer on two sides of the opening constitute a source and a drain, respectively, and the lightly doped silicon constitutes a conductive channel;

forming a second conductive layer to cover the first dielectric layer, the lightly doped silicon layer and the heavily doped silicon layer, wherein the second conductive layer includes a conductive material with a luminousness less than about 50%; and patterning the second conductive layer to form a source electrode electrically coupled to the source, a drain electrode electrically coupled to the drain, and a second electrode plate, wherein the second electrode plate, the first electrode plate and the part of the first dielectric layer on the first electrode plate constitute a capacitor, and the second electrode plate is electrically coupled to the source electrode or the drain electrode.

Optionally, each one of the first conductive layer and the second conductive layer includes at least one material selected from a group consisting of Au, Ag, Cu, Al, Ti, Cr, Mo, Cd, Ni, Co, amorphous silicon, polysilicon, amorphous SiGe, and polycrystalline SiGe.

Optionally, the MEMS light valve is formed after the TFT switches are formed, and forming the MEMS light valve includes:

forming a patterned first sacrificial layer on the substrate or the fixed optical grating, wherein the patterned first sacrificial layer defines a position of the second light valve;

forming a third conductive layer and a second dielectric layer successively on the patterned first sacrificial layer, and patterning the third conductive layer and the second dielectric layer to form the second movable optical grating and the fixed end of the second movable optical grating;

forming a patterned second sacrificial layer on the patterned third conductive layer and the patterned second dielectric layer, wherein the patterned second sacrificial layer defines a position of the first MEMS light valve;

forming a fourth conductive layer and a third dielectric layer successively on the patterned second sacrificial layer, and patterning the fourth conductive layer and the third dielectric layer to form the first light valve, and the third electrode and fourth electrode of the second light valve; and removing the patterned first sacrificial layer and the patterned second sacrificial layer.

Optionally, the method further includes:

before removing the patterned first sacrificial layer and the patterned second sacrificial layer, forming a third sacrificial layer to cover the MEMS light valve, the patterned first sacrificial layer and the patterned second sacrificial layer; and forming a cap layer on the third sacrificial layer, wherein the cap layer includes a plurality of openings to expose the third sacrificial layer, the cap layer encompasses the MEMS light valve from lateral sides of the MEMS light valve and covers a top of the MEMS light valve.

Optionally, the third sacrificial layer is removed together with the first sacrificial layer and the second sacrificial layer.

Optionally, each of the first, second and third sacrificial layers includes amorphous carbon, wherein removing the first, second and third sacrificial layers includes:

ionizing oxygen to form oxygen plasma; and inletting the oxygen plasma into the openings to ash the amorphous carbon at a temperature ranging from about 150° C. to about 450° C.

Optionally, the method further includes: after the first, second and third sacrificial layers are removed, forming a sealing cap to cover the cap layer.

Optionally, the method further includes:

after the third sacrificial layer is formed and before the cap layer is formed, patterning the third sacrificial layer to form an isolating groove among neighboring MEMS light valves, wherein the cap layer is formed on a surface of the patterned third sacrificial layer.

Optionally, each one of the cap layer and the sealing cap includes at least one material selected from a group consisting of silicon oxide, silicon nitride, silicon carbide and silicon oxynitride, and is formed using chemical vapor deposition.

Compared with conventional techniques, embodiments of the present disclosure have following advantageous.

The MEMS light valve of the present disclosure includes a first light valve and a second light valve. By controlling the movements of the first light valve and the second light valve, the fixed optical grating could be controlled to be opaque or nonopaque conveniently. Compared with a device which only has one light valve, sensitivity of the MEMS light valve of the present disclosure may be increased.

In some embodiments, the first light valve includes: a first movable optical grating, a first electrode and a second electrode. When an electric potential difference exists between the first electrode and the second electrode, the first electrode can drive the first movable optical grating to move. The second light valve includes: a second movable optical grating, a third electrode and a fourth electrode. When an electric potential difference exists between the third electrode and the fourth electrode, the third electrode can drive the second movable optical grating to move. The movement directions of the first movable optical grating and the second movable optical grating are opposite to each other. Besides, both the first light valve and the second light valve have fixed ends to connect the first light valve and the second light valve with the substrate. When the light valves are required to return to their original positions, the electric potential differences between the first and second electrodes, and between the third and fourth electrodes, may be released. As such, the fixed ends of the first light valve and the second light valve may drive them to the original positions, respectively. Therefore, the movement of the first light valve can be controlled by adjusting the electric potential difference between the first and second electrodes, and the movement of the second light valve can be controlled by adjusting the electric potential difference between the third and fourth electrodes. The MEMS light valve may be controlled conveniently, and its structure is relatively simple.

Besides, in some embodiments, the TFT switch has the first electrode plate, the second electrode and the capacitor dielectric layer therebetween constituting its capacitor. The first electrode plate and the gate are in the same layer and have the same material which is a conductive material with a luminousness less than about 50%. The second electrode plate, the source and the drain are in the same layer and have the same material which is a conductive material with a luminousness less than about 50%. When the MEMS light valve is used in the display device, since the MEMS light valve doesn't need a relatively large opening rate, the TFT switch can be disposed in the display device at a position which is not used to let light through. Further, the first electrode plate, the second electrode plate, the gate, the source and the drain all have a conductive material with a luminousness less than about 50%, so that the TFT switch can be better compatible with the MEMS light valve, which may improve the device performance. During formation of a TFT switch with such structure, the first electrode plate and the gate can be formed in the same step, the second electrode plate, the drain and the source can be formed in the same step, and the capacitor dielectric layer can be formed in the same step with the gate dielectric layer. Therefore, manufacturing process of the TFT switch may be simplified. There is no need to form the capacitor separately with the transistor. Costs may be reduced, production may be accelerated, and efficiency may be increased.

Figure 21:
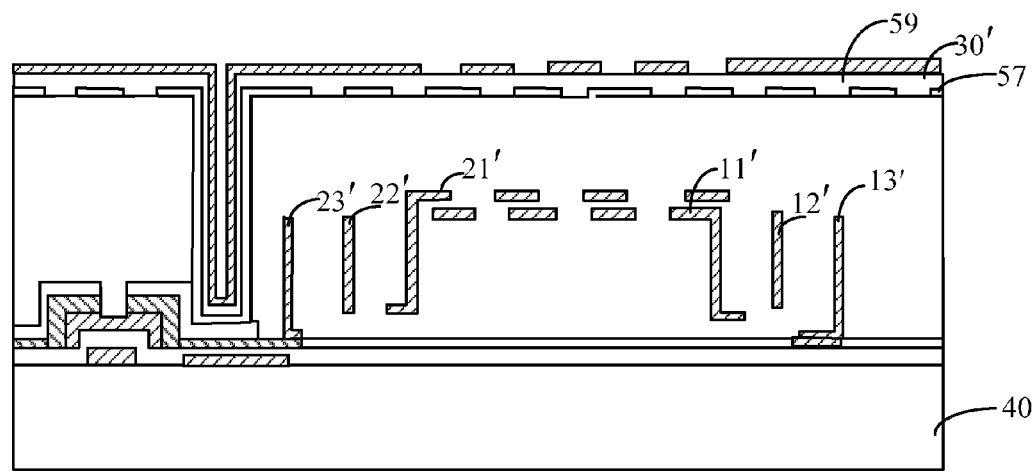
Figure 22:
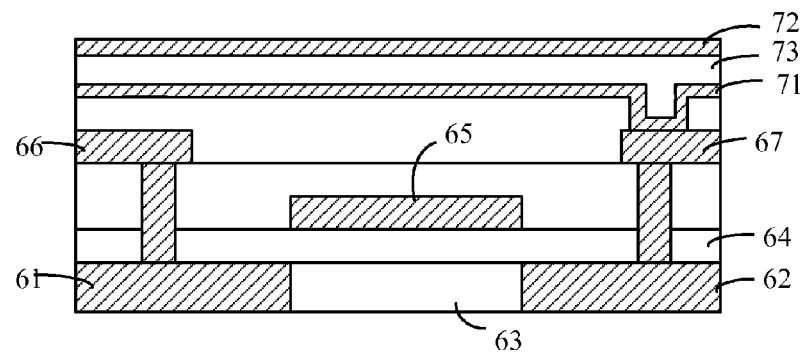
Figure 23:
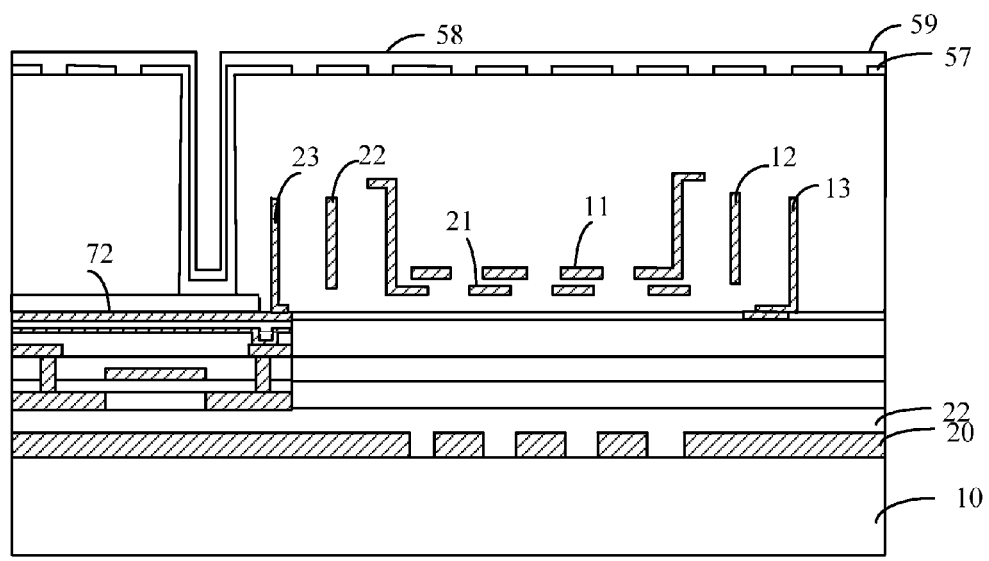

FIGS. $8a_1$, $8a_2$ to $8d$ schematically illustrate cross-sectional views of intermediate structures formed in a process for forming a TFT switch according to one embodiment of the present disclosure;

FIG. 21 schematically illustrates a cross-sectional view of a display device with a MEMS light valve according to one embodiment of the present disclosure;

FIG. 22 schematically illustrates a cross-sectional view of a LTPS-TFT switch according to one embodiment of the present disclosure; and FIG. 23 schematically illustrates applying a LTPS-TFT switch in a display device according to one embodiment of the present disclosure.

DETAILED DESCRIPTION OF THE DISCLOSURE

In order to make those skilled in the art better under the present disclosure, display devices of the present disclosure will be illustrated in detail with reference to specific embodiments hereinafter.

Figure 1A:
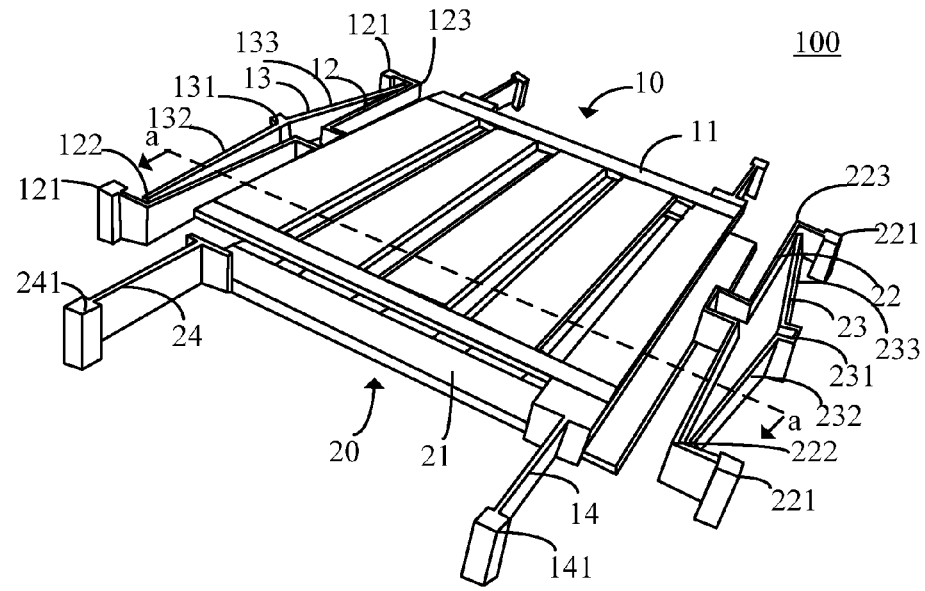
FIG. 1a schematically illustrates a three dimensional view of a micro-electromechanical system (MEMS) light valve according to one embodiment of the present disclosure.
Figure 1B:
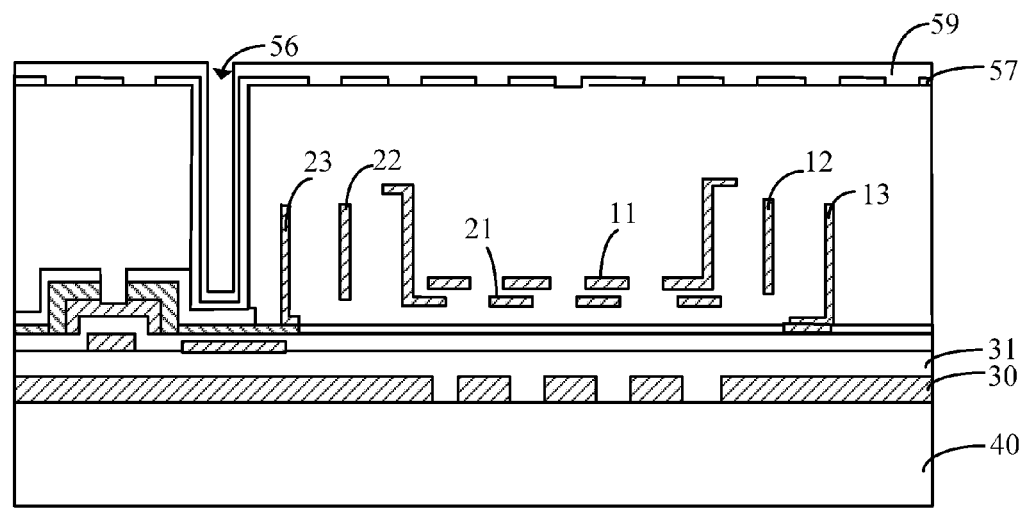
FIG. 1b schematically illustrates a cross-sectional view along a-a direction illustrated in FIG. 1a of a display device with a MEMS light valve according to one embodiment of the present disclosure.

FIG. 1a schematically illustrates a three dimensional view of a micro-electromechanical system (MEMS) valve according to one embodiment of the present disclosure. FIG. 1b schematically illustrates a display device with a MEMS light valve along a-a direction as shown in FIG. 1a. Referring to FIGS. 1a and 1b, the display device provided in one embodiment of the present disclosure may include: a substrate 40, a fixed optical grating 30 and a MEMS light valve 100 on the substrate 40. The MEMS light valve 100 is used to open and close the fixed optical grating 30. The MEMS light valve 100 includes a first light valve 10 and a second light valve 20, where the first light valve 10 is disposed on the second light valve 20. The first light valve 10 and the second light valve 20 are controlled to move, so as to control the opening and closing of the fixed optical grating 30. Besides, the first light valve 10 moves oppositely to the second light valve 20. That is to say, by controlling the movements of the first light valve 10 and the second light valve 20, the fixed optical grating 30 could be controlled to be opaque or nonopaque conveniently. Therefore, sensitivity of the MEMS light valve may be increased.

Referring to FIGS. 1a and 1b, in some embodiments, the first light valve 10 includes: a first movable optical grating 11, a first electrode 12 and a second electrode 13. The first movable optical grating 11 is fixed to the first electrode 12. The first electrode 12 and the second electrode 13 are disposed face to face, such that a capacitor is formed by the first electrode 12 and the second electrode 13. When there is an electric potential difference between the first electrode 12 and the second electrode 13, the first electrode 12 can drive the first movable optical grating 11 to move. On another side of the first movable optical grating 11, which side is corresponding to the side connected with the first electrode 12, there is mounted a fixed end 141. The first movable optical grating is held by the fixed end 141. When the electric potential difference between the first electrode 12 and the second electrode 13 disappears, the fixed end 141 can drive the first movable optical grating 11 to return to its original position.

The second light valve 20 includes: a second movable optical grating 21, a third electrode 22 and a fourth electrode 23. The third electrode 22 and the fourth electrode 23 are disposed on a side of the second movable optical grating 21, which side is opposite to the first electrode 12 and the second electrode 13. The second movable optical grating 21 is fixed to the third electrode 22. The third electrode 22 and the fourth electrode 23 are disposed face to face, such that a capacitor is formed by the third electrode 22 and the fourth electrode 23. When there is an electric potential difference between the third electrode 22 and the fourth electrode 23, the third electrode 22 can drive the second movable optical grating 21 to move. On another side of the second movable optical grating 21, which side is corresponding to the side connected with the third electrode 22, there is mounted a fixed end 241. The second movable optical grating is held by the fixed end 241. When the electric potential difference between the third electrode 22 and the fourth electrode 23 disappears, the fixed end 241 can drive the second movable optical grating 21 to return to its original position. Besides, the movement directions of the first movable optical grating 11 and the second movable optical grating 21 are opposite. Therefore, the first light valve 10 and the second light valve 20 can move correspondingly, and thereby improving the sensitivity of the MEMS light valve.

In a specific embodiment, the fixed optical grating 30 may be rectangle, having a top side, a bottom side and two lateral sides. The bottom side is a side which is close to the ground when the display device is in normal working status. The top side is opposite to the bottom side.

Accordingly, each of the first movable optical grating 11 and the second movable optical grating 21 is also rectangle and has a first side, a second side, a third side and a fourth side. The first side and the third side are opposite to each other. The first side is corresponding to the top side of the fixed optical grating 30. The third side is corresponding to the bottom side of the fixed optical grating 30. The second side and the fourth side are opposite to each other and are respectively corresponding to two lateral sides of the fixed optical grating 30. In some embodiments, the first electrode 12 and the second electrode 13 are disposed on a side where the second side of the first movable optical grating 11 locates. The fixed end 141 of the first movable optical grating 11 is disposed on a side where the fourth side of the first movable optical grating 11 locates. The third electrode 22 and the fourth electrode 23 are disposed on a side where the fourth side of the second movable optical grating 21 locates. The fixed end 241 of the second movable optical grating 21 is disposed on a side where the second side of the second movable optical grating 21 locates.

In some embodiments, the first electrode 12 includes a first plate 122 and a second plate 123 which are connected with the first movable optical grating 11 and are disposed symmetrically. Each of the first plate 122 and the second plate 123 has an end apart from the first movable optical grating 11 which is called a first fixed end 121. The first electrode 12 is fixed by the first fixed ends 121. Beside, the first ends 121 are used to be electrically connected with and fixed to TFT switches. The second electrode 13 includes a third plate 132 and a fourth plate 133 which are disposed correspondingly with the first plate 122 and the second plate 123, respectively. The third plate 132 and the fourth plate 133 have a second fixed end 131 between them. The second fixed end 131 connects the third plate 132 and the fourth plate 133, and fixes the second electrode 13. A distance between the second fixed end 131 and the first electrode 12 is greater than a distance between the first electrode 12 and any of the two lateral ends of the second electrode 13. The second fixed end 131 is used to be electrically connected with and fixed to a TFT switch. Further, in some embodiments, an angle formed by the third plate 132 and the fourth plate 133 is not 180°, but larger than 90° and less than 180°. Such that, the first electrode and the second electrode are closest to each other at their two lateral ends, i.e., the distance between the second fixed end and the first electrode is greater than a distance between the first electrode and any of the two lateral ends of the second electrode. Therefore, charge may accumulate at the lateral ends. Such that, even when the electric potential difference between the first electrode and the second electrode is relatively small, the second electrode may still be able to attract the first electrode to move. In some embodiments, the first electrode and the second electrode may be in parallel with each other.

The third electrode 22 and the fourth electrode 23 are disposed on a side where the fourth side of the second movable optical grating 21 locates. Besides, the fourth electrode 23 and the fourth side are disposed on two sides of the third electrode 22, i.e., the third electrode 22 and the fourth electrode 23, and the first electrode 12 and the second electrode 12 are disposed on opposite sides. Such that, the movement directions of the first movable optical grating 11 and the second movable optical grating 21 are opposite.

In some embodiments, the third electrode 22 includes a first plate 222 and a second plate 223 which are connected with the second movable optical grating 21 and are disposed symmetrically. Each of the first plate 222 and the second plate 223 has an end apart from the second movable optical grating 21 which is called a third fixed end 221. The third electrode 22 is fixed by the third fixed ends 221. The third fixed ends 221 are used to be electrically connected with and fixed to TFT switches. The fourth electrode 23 includes a third plate 232 and a fourth plate 233 which are disposed correspondingly with the first plate 222 and the second plate 223, respectively. The third plate 232 and the fourth plate 233 have a fourth fixed end 231 between them. The fourth fixed end 231 connects the third plate 232 and the fourth plate 233 and fixes the fourth electrode 23. A distance between the fourth fixed end 231 and the third electrode 22 is greater than a distance between the third electrode 22 and any of the other two lateral ends of the fourth electrode 23. The fourth fixed end 231 is used to be electrically connected with and fixed to a TFT switch. Further, in some embodiments, an angle formed by the third plate 232 and the fourth plate 233 is not 180°, but larger than 90° and less than 180°. Such that, the third electrode and the fourth electrode are closest to each other at their two lateral ends, i.e., the distance between the fourth fixed end and the third electrode is greater than a distance between the third electrode and any of the two lateral ends of the fourth electrode. Therefore, charge may accumulate at the lateral ends. Such that, even when the electric potential difference between the third electrode and the fourth electrode is relatively small, the fourth electrode may still be able to attract the third electrode to move. In some embodiments, the third electrode and the fourth electrode may be in parallel with each other.

In some embodiments, the first light valve 10 further includes a first fixed plate 14 which is fixed to the first movable optical grating 11 at its fourth side. In some embodiments, along with the fourth side, there may be two of the first fixed plates 14 which are disposed symmetrically at the fourth side of the first movable optical grating 11 and extend beyond the first side and the third side, respectively. The first movable optical grating 11 may have two fixed ends 141 respectively disposed at ends of the first fixed plates 14, which ends are apart from the first movable optical grating 11, i.e., ends not connected with the first movable optical grating 11. The fixed ends 141 are fixed to and electrically connected with corresponding TFT switches. Such that, the first movable optical grating 11 is fixed by the fixed ends 141.

In some embodiments, the second light valve 20 further includes a second fixed plate 24 which is fixed to the second movable optical grating 21 at its second side. In some embodiments, along with the second side, there may be two of the second fixed plates 24 which are disposed symmetrically at the second side of the second movable optical grating 21 and extend beyond the first side and the third side, respectively. The second movable optical grating 21 may have two fixed ends 241 respectively disposed at ends of the second fixed plates 24, which ends are apart from the second movable optical grating 21, i.e., ends not connected with the second movable optical grating 21. The fixed ends 241 are fixed to and electrically connected with corresponding TFT switches. Such that, the second movable optical grating 21 is fixed by the fixed ends 241.

In a specific embodiment as shown in FIGS. 1a and 1b, since the fixed optical grating 30 is a rectangle, the first movable optical grating 11 and the second movable optical grating 21 corresponding to the fixed optical grating 30 are also rectangle. There are a plurality of strip-shaped nonopaque openings on each the fixed optical grating 30, the first movable optical grating 11 and the second movable optical grating 21. The openings are parallel with the second side and the fourth side. When the nonopaque openings of the fixed optical grating 30, the first movable optical grating 11 and the second movable optical 21 coincide with each other, i.e., when the nonopaque openings of the fixed optical grating 30 are not completely covered by opaque parts of the first movable optical grating 11 and the second movable optical 21, light emitted from a backlight source in the substrate 40 can pass across the nonopaque openings of the fixed optical grating 30, the first movable optical grating 11 and the second movable optical 21. Further, quantity of the light penetrating through the openings can be adjusted based on a range of the nonopaque openings of the fixed optical grating 30 being covered by the opaque parts of the first movable optical grating 11 and the second movable optical 21.

The action mechanism of the display device will be illustrated as follows. The first fixed ends 121 of the first electrode 12 and the second fixed end 131 of the second electrode 13 are electrically coupled to peripheral control circuits through TFT switches (not shown in FIGS. 1a and 1b). For example, if a 0V voltage is applied to the first electrode 12, and a 10V voltage is applied to the second electrode 13, a 10V electric potential difference may exist between the first electrode 12 and the second electrode 13. The first electrode 12 may carry negative charge, while the second electrode may carry positive charge. Thus, the first electrode 12 may be subject to a leftward electrostatic force. As such, the first electrode 12 can drive the first movable optical grating 11 which is fixed thereto to move leftward. As the first fixed ends 121 of the first electrode 12 are fixed to corresponding TFT switches and the second fixed end 131 of the second electrode 13 is fixed to a corresponding TFT switch, when the first electrode 12 is driving the first movable optical grating 11 to move, the first electrode 12, the second electrode 13 and the first movable optical grating 11 fixed to the first electrode 12 may have deformations. To let the first movable optical grating 11 move rightward to return to its original position, a 0V voltage may be applied to the second electrode 13, while the 0V voltage applied to the first electrode 12 is maintained. As a result, the electric potential difference between the first electrode 12 and the second electrode 13 is 0V, and the corresponding electrostatic force is also 0. Under the effect of the fixed end 141 of the first light valve, the first electrode 12, the second electrode 13 and the first movable optical grating 11 may return to their former positions and original shapes.

The third fixed ends 221 of the third electrode 22 and the fourth fixed end 231 of the fourth electrode 23 are electrically coupled to peripheral circuits through TFT switches. For example, if a 0V voltage is applied to the third electrode 22, and a 10V voltage is applied to the fourth electrode 23, a 10V electric potential difference may exist between the third electrode 22 and the fourth electrode 23. The third electrode 22 may carry negative charge, while the second electrode may carry positive charge. Thus, the third electrode 22 may be subject to a rightward electrostatic force. As such, the third electrode 22 can drive the second movable optical grating 21 which is fixed thereto to move rightward. As the third fixed ends 221 of the third electrode 22 are fixed to corresponding TFT switches and the fourth fixed end 231 of the fourth electrode 23 is fixed to a corresponding TFT switch, when the third electrode 22 is driving the second movable optical grating 21 to move, the third electrode 22, the fourth electrode 23 and the second movable optical grating 21 fixed to the third electrode 22 may have deformations. To let the second movable optical grating 21 move leftward to return to its original position, a 0V voltage may be applied to the fourth electrode 23, while the 0V voltage applied to the third electrode 22 is maintained. As a result, the electric potential difference between the third electrode 22 and the fourth electrode 23 is 0V, and the corresponding electrostatic force is also 0. Under the effect of the fixed end 241 of the second light valve, the third electrode 22, the fourth electrode 23 and the second movable optical grating 21 may return to their former positions and original shapes.

It should be noted that the above described voltage values are merely for illustrating the action mechanism of the MEMS light valve. In practice, the voltages applied to the electrodes may be adjusted based on real situations.

In some embodiments, the first movable optical grating 11, the first electrode 12, the second electrode 12, the first fixed plate 14, the second movable optical grating 21, the third electrode 22, the fourth electrode 23 and the second fixed plate 24 may include a conductive material. The conductive material may be metal, such as Au, Ag, Cu, Al, Ti, Cr, Mo, Cd, Ni, Co, or a combination thereof. The conductive material may be a conductive nonmetal material, such as poly-silicon, amorphous silicon, amorphous silicon germanium, poly-silicon germanium, or the like. The conductive material may also be a combination of a metal and a conductive nonmetal material. In some embodiments, Al is selected. A insulation layer may be formed on each of the first movable optical grating 11, the first electrode 12, the second electrode 12, the first fixed plate 14, the second movable optical grating 21, the third electrode 22, the fourth electrode 23 and the second fixed plate 24. The insulation layer may include silicon oxide, silicon nitride, silicon carbide or silicon oxynitride.

In the specific embodiment as shown in FIGS. 1a and 1b, the fixed optical grating 30 is formed on the substrate 40, the second light valve 20 is formed on the fixed optical grating 30 and the first light valve 10 is formed on the second light valve 20. In some embodiments, the MEMS light valve 100 and the fixed optical grating 30 may be disposed upside down. That is to say, the second light valve 20 is formed on the substrate 40, the first light valve 10 is formed on the second light valve 20, and the fixed optical grating 30 is formed on the first light valve 10.

In the specific embodiment as shown in FIGS. 1a and 1b, a thin film transistor (TFT) array (not shown in FIGS. 1a and 1b) is formed on the fixed optical grating 30 within a region which is not used to control luminousness. TFT switches in the TFT array are used to be electrically coupled with and fixed to the first, second, third and fourth electrodes.

In some embodiments, the substrate 40 includes a backlight source therein. The backlight source may include a blue light source, a red light source and a green light source which may be provided by a blue light LED, a red light LED and a green light LED, or provided by laser beams which can generate beams with red, green and blue colors. In some embodiments, a surface of the fixed optical grating 30 facing the backlight source has a reflection rate greater than 60%.

In the display device, there may be provided with a plurality of fixed optical gratings 30 and a plurality of MEMS light valves 100 arranged in array. Only one fixed optical grating 30 and one MEMS light valve 100 may be described here as an example.

Figure 2:
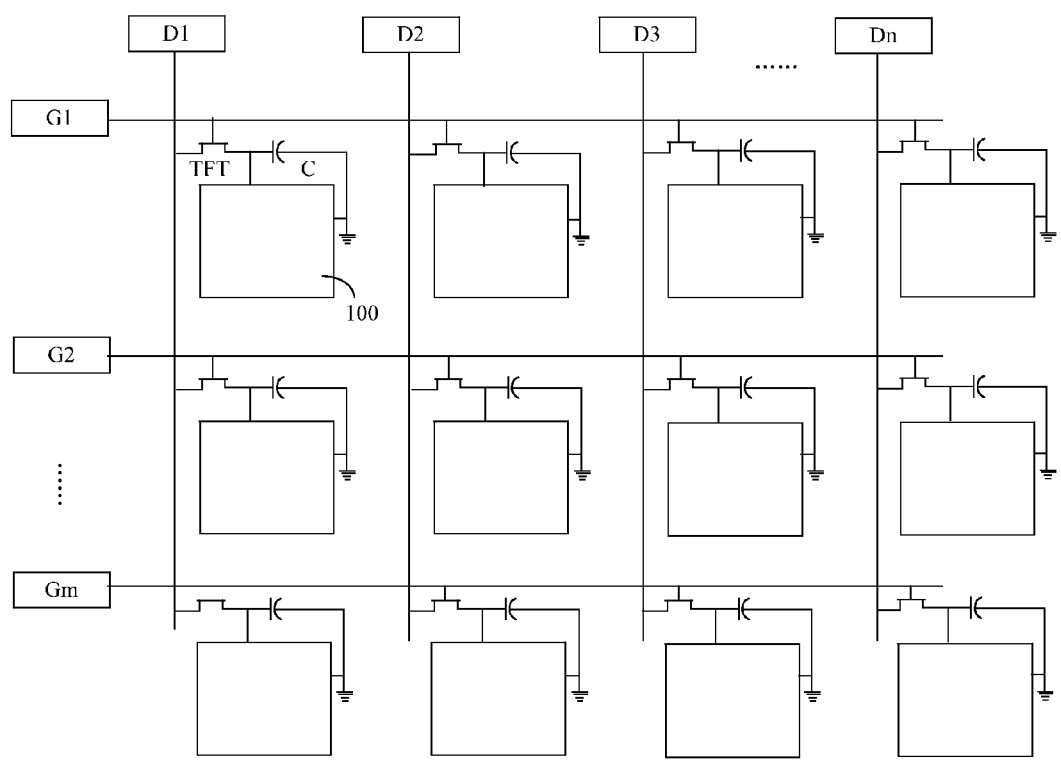
FIG. 2 schematically illustrates a circuit structure of a display device with a MEMS light valve according to one embodiment of the present disclosure.

FIG. 2 schematically illustrates a circuit structure of the display device according to one embodiment. Referring to FIG. 2, the display device further includes: a plurality of scan lines G1, G2 . . . Gm on the substrate; and a plurality of data lines D1, D2 . . . Dn on the substrate. The plurality of scan lines G1, G2 . . . Gm are parallel with each other, and the plurality of data lines D1, D2 . . . Dn are parallel with each other. The plurality of scan lines G1, G2 . . . Gm are vertical with the plurality of data lines D1, D2 . . . Dn. The plurality of data lines D1, D2 . . . Dn are electrically coupled to source electrodes of corresponding TFT switches, respectively. The plurality of scan lines G1, G2 . . . Gm are electrically coupled to gate electrodes of the corresponding TFT switches, respectively. The corresponding TFT switches are controlled to open and close using the plurality of scan lines G1, G2 . . . Gm. Voltages are applied to the corresponding TFT switches, whose drains are electrically coupled to corresponding MEMS light valves 100, using the plurality of data lines D1, D2 . . . Dn. Therefore, voltages applied to the MEMS light valves 100 are controlled using the plurality of data lines D1, D2 . . . Dn. The display device further includes capacitors C to be electrically coupled to the MEMS light valves 100. It should be noted that not all the TFT switches corresponding to each MEMS light valve 100 are labeled in FIG. 2.

Figure 8:
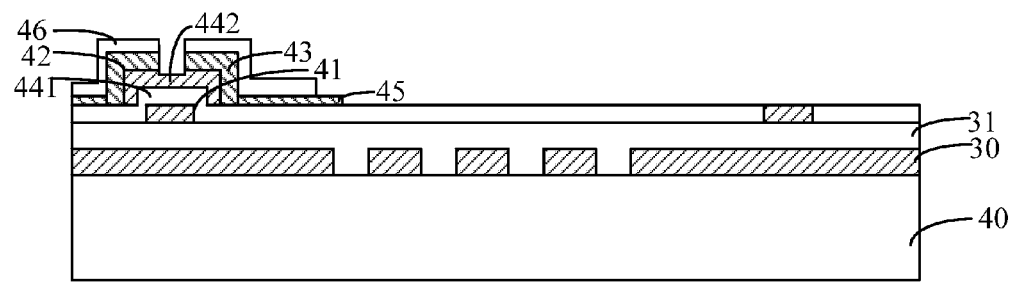
Figure 8D:
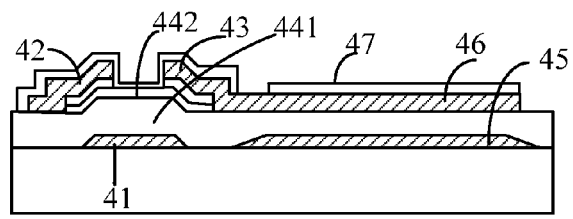

Referring to FIG. 8*d*, the TFT switch provided according to one embodiment includes a gate 41, a source, a drain and a conductive channel for electrically conducting the source and the drain. A gate dielectric layer 441 is formed between the conductive channel and the gate 41. A source electrode 42 is electrically coupled to the source, and a drain electrode 43 is electrically coupled to the drain. The TFT switch further includes a capacitor. The capacitor includes a first electrode plate 45, a second electrode plate 46 and a capacitor dielectric layer (not labeled in FIG. 8*d*) therebetween. The first electrode plate 45 and the gate 41 are in the same layer and include the same material which is opaque. The second electrode plate 46, the source electrode 42 and the drain electrode 43 are in the same layer and include the same material which is opaque. The second electrode plate 46 is electrically coupled to the drain electrode 43 and the first electrode plate 45 is grounded. The first electrode 12, the second electrode 13, the third electrode 22 and the fourth electrode 23 are respectively electrically coupled to the drains 43 of corresponding TFT switches. The sources 42 of the TFT switches are electrically coupled to data lines of the display device. The first electrode plate 45, the second electrode plate 46 and the capacitor dielectric layer disposed therebetween constitute the capacitor C.

In some embodiments, the second electrode plate 46 is electrically coupled to the drain 43. The MEMS light valve is electrically coupled to the drain 43 through the second electrode plate. The data line 49 is electrically coupled to the source 42. In some embodiments, the second electrode plate 46 is electrically coupled to the source 42. The MEMS light valve is electrically coupled to the source 43 through the second electrode plate. The data line 49 is electrically coupled to the drain 43. Detail configuration may be determined based on types of the source and drain.

In some embodiments, the capacitor dielectric layer and the gate dielectric layer are in the same layer and have the same material. In a manufacturing process, a dielectric layer is formed on the gate 41 and the first electrode plate 45, where a part thereof on the gate 41 forms the gate dielectric layer and a part thereof on the first electrode plate 45 forms the capacitor dielectric layer.

The first electrode plate, the second electrode plate, the gate, the source electrode and the drain electrode may include a metal material, such as Au, Ag, Cu, Al, Ti, Cr, Mo, Cd, Ni, Co or a combination thereof, or selected from Au, Ag, Cu, Al, Ti, Cr, Mo, Cd, Ni, Co, poly-silicon, amorphous silicon, poly-silicon germanium, amorphous silicon germanium, and a combination thereof. The capacitor dielectric layer and the gate dielectric layer may include a material selected from silicon oxide, silicon nitride, silicon carbide, silicon oxynitride, and a combination thereof. In some embodiments, both the first electrode plate 45 and the second electrode plate 46 may include metal, so the capacitor C is a metal-insulator-metal (MIM) capacitor.

The TFT switches of the present disclosure may be formed in opaque parts of a display device with MEMS light valves, as the MEMS light valves may not need relatively large opening rates. Besides, the first electrode plate, the second electrode plate, the gate, the source electrode and the drain electrode include a material with a luminousness less than 50%. Therefore, the TFT switches and the MEMS light valves may be better integrated and thus improving the device performance.

Further, referring to FIG. 1*b*, in some embodiments, the display device may include a cap layer and a sealing cap. The cap layer 57 may surround the lateral sides of the MEMS light valve and cover the top of the MEMS light valve. The cap layer 57 may have openings (not labeled in FIG. 1*b*) on top. The sealing cap 59 may seal the openings. In some embodiments, the sealing cap 59 may not only seal the openings, but also overlay the entire top portion of the sealing cap 57. The cap layer 57 and the sealing cap 59 may include a material selected from silicon oxide, silicon nitride, silicon carbide, silicon oxynitride and a combination thereof. The sealing cap 59 may perform a sealing function to prevent steam, dust, impurities and the like from entering into the display device, thereby increasing the service life of the display device.

In embodiments described above, the fixed optical grating 30, and the first movable optical grating 11 and the second movable optical grating 21 are rectangle. However, in some embodiments, the fixed optical grating 30, the first movable optical grating 11 and the second movable optical grating 21 may not be rectangle. For example, the fixed optical grating may be round and have a plurality of fan-shaped nonopaque openings. The movable optical gratings may be round and have a plurality of fan-shaped nonopaque openings.

Figure 3:
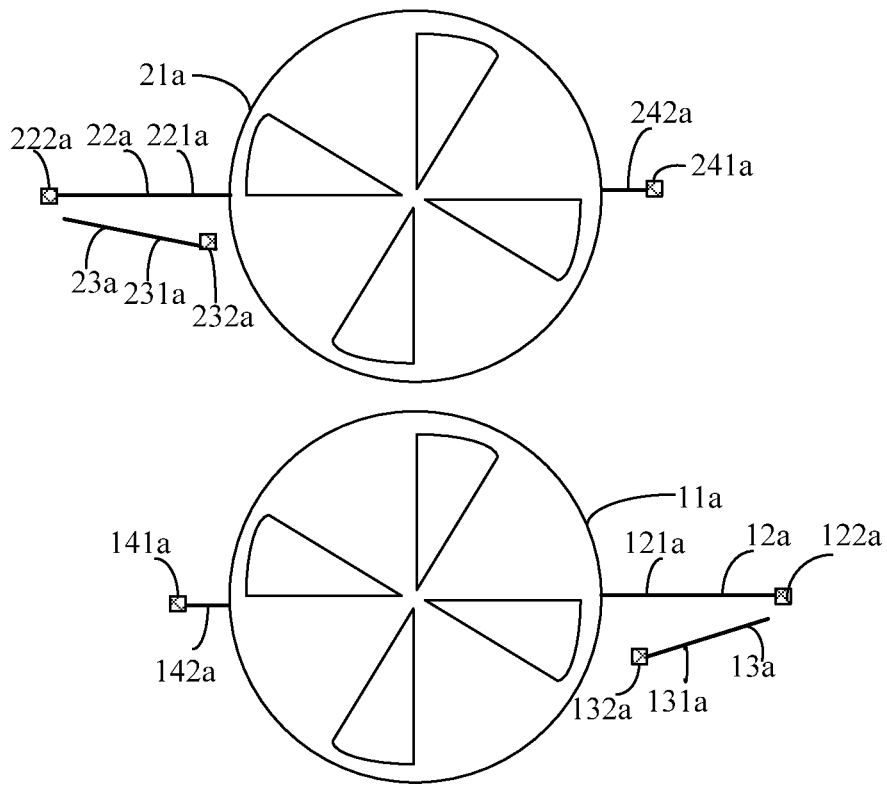
FIG. 3 schematically illustrates a top view of a MEMS light valve according to one embodiment of the present disclosure.

FIG. 3 schematically illustrates a top view of a MEMS light valve according to another embodiment of the present disclosure. The MEMS light valve may have a fixed optical grating which may be round (not shown in FIG. 3) and may have a plurality of nonopaque fan-shaped openings. Referring to FIG. 3, a first movable optical grating 11*a* and a second movable optical grating 12*a* also may be round and have a plurality of fan-shaped nonopaque openings to be corresponding to the fixed optical grating. Since FIG. 3 is a planar view, the first light valve and the second light valve may be illustrated on the same plane in FIG. 3.

A first electrode 12*a* is fixed to and electrically coupled with the circumference edge of the first movable optical grating 11*a*. A second electrode 13*a* is disposed correspondingly with the first electrode 12*a*, such that a capacitor is formed. When an electric potential difference exists between the first electrode 12*a* and the second electrode 13*a*, an attraction force is generated therebetween. The first electrode 12*a* can drive the first movable optical grating 11*a* to rotate under the effect of the attraction force. On another side of the first movable optical grating 11*a* opposing to the first electrode 12*a*, a fixed end 141*a* is provided. When there is no electric potential difference between the first electrode 12*a* and the second electrode 13*a*, the fixed end 141*a* can drive the first movable optical grating 11*a* to return to its original position. Detail action mechanism may be obtained by referring to descriptions of embodiments regarding FIG. 1*a*.

A third electrode 22*a* is fixed to and electrically coupled with the circumference edge of the second movable optical grating 21*a*. A fourth electrode 23*a* is disposed correspondingly with the third electrode 22*a*, such that a capacitor is formed. When an electric potential difference exists between the third electrode 22*a* and the fourth electrode 23*a*, an attraction force is generated therebetween. The third electrode 22*a* can drive the second movable optical grating 21*a* to rotate under the effect of the attraction force. On another side of the second movable optical grating 21a opposing to the third electrode 22a, a fixed end 241a is provided. When there is no electric potential difference between the third electrode 22a and the fourth electrode 23a, the fixed end 241a can drive the second movable optical grating 21a to return to its original position. Detail action mechanism may be obtained by referring to descriptions of embodiments regarding FIG. 1a.

The first electrode 12a includes a first plate 121a which is connected to the circumference edge of the first movable optical grating 11a. At an end of the first plate 121a which is apart from the first movable optical grating 11a, there is provided a first fixed end 122a through which the first electrode 12a is fixed. The second electrode 13a includes a second plate 131a which is disposed correspondingly with the first plate 121a. The second plate 131a is provided with a second fixed end 132a which is closer to the first movable optical grating 11a. Another end of the second plate 131a apart from the second fixed end 132a is apart from the first movable optical grating 11a. The second electrode 13a is fixed by the second fixed end 132a. The first electrode 12a is closer to the end of the second plate 131a which is apart from the second fixed end 132a than to the second fixed end 132a. The third electrode 22a includes a third plate 221a which is connected to the circumference edge of the second movable optical grating 21a. At an end of the third plate 221a which is apart from the second movable optical grating 21a, there is provided a third fixed end 222a through which the third electrode 22a is fixed. The fourth electrode 23a includes a fourth plate 231a which is disposed correspondingly with the third plate 221a. The fourth plate 231a is provided with a fourth fixed end 232a which is closer to the second movable optical grating 21a. Another end of the fourth plate 231a apart from the fourth fixed end 232a is apart from the second movable optical grating 21a. The fourth electrode 23a is fixed by the fourth fixed end 232a. The third electrode 22a is closer to the end of the fourth plate 231a which is apart from the fourth fixed end 232a than to the fourth fixed end 232a.

The first light valve further includes a first fixed plate 142a which is disposed on a side of the round first movable optical grating 11a and fixed to the circumference edge of the first movable optical grating 11a. A fixed end 141a of the first movable optical grating 11a is disposed at an end of the first fixed plate 142a which is apart from the first movable optical grating 11a. The second light valve further includes a second fixed plate 242a which is disposed on a side of the round second movable optical grating 21a and fixed to the circumference edge of the second movable optical grating 21a. A fixed end 241a of the second movable optical grating 21a is disposed at an end of the second fixed plate 242a which is apart from the second movable optical grating 21a.

When voltages are applied to the electrodes, respectively, the MEMS light valve may rotate due to an electrostatic force. Such that, how well the nonopaque openings of the fixed optical grating and the movable optical gratings are coinciding with each other may be controllable. How much light can pass through the optical gratings is thus controllable. Detail action mechanism may not be illustrated here.

Figure 4:
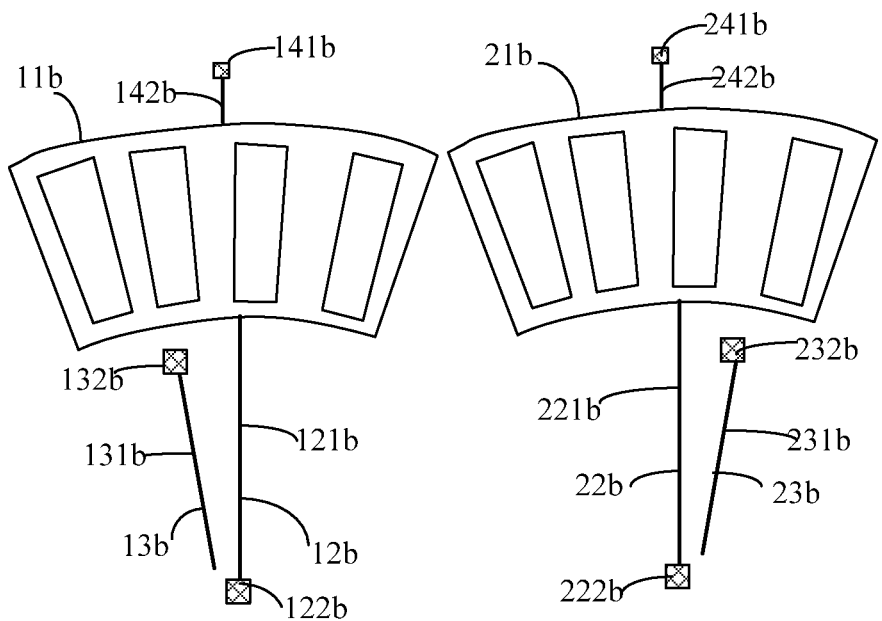
FIG. 4 schematically illustrates a top view of a MEMS light valve according to one embodiment of the present disclosure.

FIG. 4 schematically illustrates a top view of a MEMS light valve according to another embodiment of the present disclosure. The MEMS light valve may have a fixed optical grating which may be fan-shaped (not shown in FIG. 4) and may have a plurality of nonopaque strip-shaped openings. Referring to FIG. 4, a first movable optical grating 11b and a second movable optical grating 12b also may be fan-shaped and have a plurality of strip-shaped nonopaque openings (not labeled in FIG. 4) to be corresponding to the fixed optical grating. Since FIG. 4 is a planar view, the first light valve and the second light valve may be illustrated on the same plane in FIG. 4.

A first electrode 12b is fixed to and electrically coupled with the shorter arc edge of the fan-shaped first movable optical grating 1ib. A second electrode 13b is disposed correspondingly with the first electrode 12b, such that a capacitor is formed. When an electric potential difference exists between the first electrode 12b and the second electrode 13b, an attraction force is generated therebetween. The first electrode 12b can drive the first movable optical grating 11b to rotate under the effect of the attraction force. On another side of the first movable optical grating 11b opposing to the first electrode 12b, i.e., the longer arc edge, a fixed end 141b is provided. When there is no electric potential difference between the first electrode 12b and the second electrode 13b, the fixed end 141b can drive the first movable optical grating 11b to return to its original position. Detail action mechanism may be obtained by referring to descriptions of embodiments regarding FIG. 1a.

A third electrode 22b is fixed to and electrically coupled with the shorter arc edge of the second movable optical grating 21b. A fourth electrode 23b is disposed correspondingly with the third electrode 22b, such that a capacitor is formed. When an electric potential difference exists between the third electrode 22b and the fourth electrode 23b, an attraction force is generated therebetween. Besides, the position relation between the third electrode 22b and the fourth electrode 23b is opposite to the position relation between the first electrode 12b and the second electrode 13b. therefore, when the second movable optical grating 21b is driven to rotate as a result of the attraction force, the rotation directions of the first light valve and the second light valve are configured to be opposite. On another side of the second movable optical grating 21b opposing to the third electrode 22b, i.e., the longer arc edge, a fixed end 241b is provided. When there is no electric potential difference between the third electrode 22b and the fourth electrode 23b, the fixed end 241b can drive the second movable optical grating 21b to return to its original position. Detail action mechanism may be obtained by referring to descriptions of embodiments regarding FIG. 1b.

The first electrode 12b includes a first plate 121b which is connected to the shorter arc edge of the first movable optical grating 11b. At an end of the first plate 121b which is apart from the first movable optical grating 11b, there is provided a first fixed end 122b through which the first electrode 12b is fixed. The second electrode 13b includes a second plate 131b which is disposed correspondingly with the first plate 121b. The second plate 131b is provided with a second fixed end 132b which is closer to the first movable optical grating 11b. Another end of the second plate 131b apart from the second fixed end 132b is apart from the first movable optical grating 11b. The second electrode 13b is fixed by the second fixed end 132b. The first electrode 12b is closer to the end of the second plate 131b which is apart from the second fixed end 132b than to the second fixed end 132b. The third electrode 22b includes a third plate 221b which is connected to the shorter arc edge of the second movable optical grating 21b. At an end of the third plate 221b which is apart from the second movable optical grating 21b, there is provided a third fixed end 222b through which the third electrode 22b is fixed. The fourth electrode 23b includes a fourth plate 231b which is disposed correspondingly with the third plate 221b. The fourth plate 231b is provided with a fourth fixed end 232b which is closer to the second movable optical grating 21b. Another end of the fourth plate 231b apart from the fourth fixed end 232b is apart from the second movable optical grating 21b. The fourth electrode 23b is fixed by the fourth fixed end 232b. The third electrode 22b is closer to the end of the fourth plate 231b which is apart from the fourth fixed end 232b than to the fourth fixed end 232b.

The first light valve further includes a first fixed plate 142b which is disposed on a side of the first movable optical grating 11b and fixed to the longer arc edge of the first movable optical grating 11b. A fixed end 141b of the first movable optical grating 11b is disposed at an end of the first fixed plate 142b which is apart from the first movable optical grating 11b. The second light valve further includes a second fixed plate 242b which is disposed on a side of the fan-shaped second movable optical grating 21b and fixed to the longer arc edge of the second movable optical grating 21b. A fixed end 241b of the second movable optical grating 21b is disposed at an end of the second fixed plate 242b which is apart from the second movable optical grating 21b.

When voltages are applied to the electrodes, respectively, the MEMS light valve may rotate due to an electrostatic force. Such that, how well the nonopaque openings of the fixed optical grating and the movable optical gratings are coinciding with each other may be controllable. How much light can pass through the optical gratings is thus controllable. Detail action mechanism may not be illustrated here.

In some embodiments, the TFT switches may be replaced by low temperature poly-silicon TFT (LTPS-TFT) switches.

FIG. 22 schematically illustrates a cross-sectional view of a LTPS-TFT switch. FIG. 23 schematically illustrates applying the LTPS-TFT switch in a display device. Referring to FIG. 22, the LTPS-TFT switch may include: a source 61, a drain 62, a channel region 63 between the source 61 and the drain 62, a gate dielectric layer 64 on the channel 63 and a gate 65 on the gate dielectric layer 64. The source 61 is electrically coupled to a source electrode 66 through a first plug. The drain 62 is electrically coupled to a drain electrode 67 through a second plug. Data lines of the display device (not shown in FIG. 22) are electrically coupled to the drain electrode 67. Scan lines of the display device (not shown in FIG. 22) are electrically coupled to the gate 65. The LTPS-TFT switch may further include a capacitor on the source electrode 66 and the drain electrode 67. The capacitor may include a first plate 71, a second plate 72 and a capacitor dielectric layer 73 therebetween. The first plate 71 may be disposed on the source electrode 66 and the drain electrode 67, and electrically coupled to the drain electrode 67. The capacitor dielectric layer 73 is on the first plate 71, and the second plate 72 is on the capacitor dielectric layer 72.

In some embodiments, the TFT switches, or the LTPS-TFT switches may be replaced by other switch circuits, such as MEMS switches, and the like.

Figure 5:
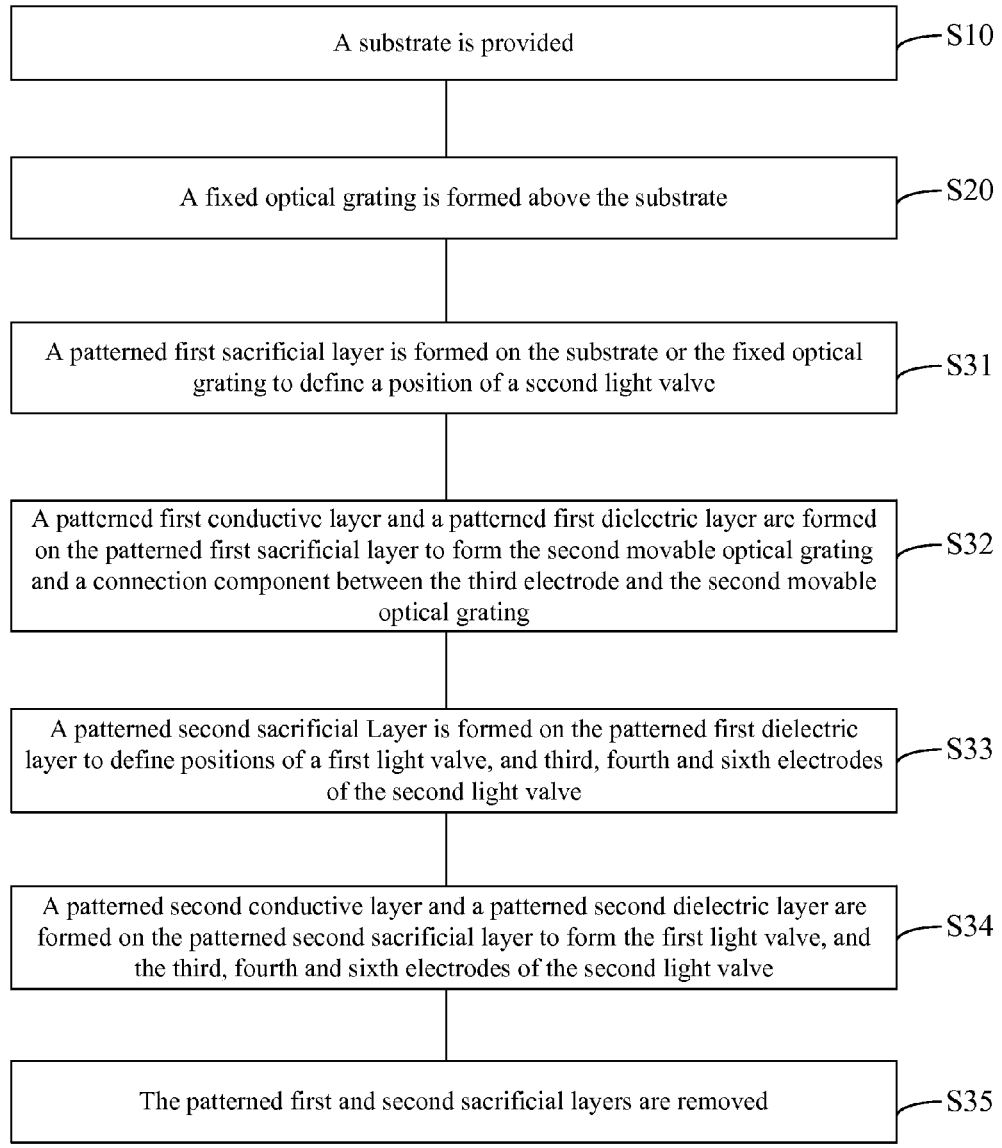
FIG. 5 schematically illustrates a flow chart of a method for forming a display device with a MEMS light valve according to one embodiment of the present disclosure.

Accordingly, methods for forming a display device are provided in the present disclosure. FIG. 5 schematically illustrates a flow chart of a method for forming a display device according to one embodiment. FIGS. 6 to 20 are schematic cross-sectional views of intermediate structures formed in the formation process of the display device. The method for forming a display device will be described in detail with reference to FIG. 5 and FIGS. 6 to 20.

Figure 6:
FIGS. 6 to 20 schematically illustrate cross-sectional views of intermediate structures formed in a process for forming a display device with a MEMS light valve according to one embodiment of the present disclosure.

Referring to FIGS. 5 and 6, performing step S11, a substrate 40 is provided. In some embodiments, the substrate 40 may be a glass substrate. In some embodiments, the substrate 40 includes a backlight source (not shown in FIG. 6) therein. The backlight source may include a blue light source, a red light source and a green light source which may be provided by a blue light LED, a red light LED and a green light LED, or provided by laser beams which can generate beams with red, green and blue colors.

Figure 7:
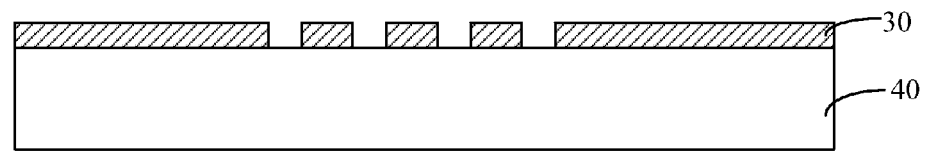

Referring to FIGS. 5 and 7, performing step S12, a fixed optical grating 30 is formed on the substrate 40. In some embodiments, forming the fixed optical grating 30 may include: forming a conductive layer on the substrate 40; and patterning the conductive layer to form a fixed optical grating 30 using photolithography and etching. In some embodiments, the fixed optical grating 30 may include a material selected from Au, Ag, Cu, Al, Ti, Cr, Mo, and the like. In some embodiments, the fixed optical grating 30 may include Al. In some embodiments, forming the conductive layer may include chemical vapor deposition or physical vapor deposition.

In some embodiments, after the fixed optical grating is formed and before the formation of a MEMS light valve, a TFT switch may be formed on the fixed optical grating.

Referring to FIG. 8, in some embodiments, after the fixed optical grating 30 is formed, a dielectric layer 31 is formed to cover the fixed optical grating 30. The dielectric layer 31 may include $SiO_2$, SiOC, or SiON. The dielectric layer 31 may be formed using chemical vapor deposition. Thereafter, TFT switches are formed on the dielectric layer 31. Each switch may be corresponding to a first, second, third or fourth electrode.

In some embodiments, forming the TFT switch may include following steps.

Referring to FIGS. 8a1 and 8a2, performing step a, a first conductive layer is formed above the fixed optical grating. The first conductive layer may include a material with a luminousness less than 50%. The material of the first conductive layer may be selected by referring to above description about the TFT switch. In some embodiments, the first conductive layer may have a stacked structure including a Ti layer, a Al layer and a Ti layer, or a stacked structure including a Al layer and a Mo layer. Or else, the first conductive layer may be a Cr layer, a Mo layer or a Ta layer. The first conductive layer may be formed using chemical vapor deposition or physical vapor deposition. Thereafter, performing step b, the first conductive layer is patterned to form a gate 41 and a first electrode plate 45. Specifically, after exposure with a mask, development and dry etch, the gate 41, the first electrode plate 45 and a scan line 48 are formed in the first conductive layer.

Referring to FIGS. 8b1 and 8b2, performing step c, a first dielectric layer 441 is formed to cover the gate and the first electrode plate. The first dielectric layer on the first electrode plate is to be used as a capacitor dielectric layer. Performing step d, a lightly doped silicon layer 442 and a heavily doped silicon 443 are successively formed on the first dielectric layer on the gate 41. The heavily doped silicon layer 443 has an opening, on two sides of which are formed a source and a drain. The opening exposes the lightly doped silicon layer 442 which constitutes a conductive channel.

In some embodiments, the first dielectric layer may include $SiO_2$, SiN, SiON, SiOC, or the like, or a combination thereof. Using plasma enhanced chemical vapor deposition (PECVD) to continuously forming films, the first dielectric layer 441, the lightly doped silicon layer 442 and the heavily doped silicon layer 443 can be formed. Specifically, the first dielectric layer 441 is firstly formed using PECVD to cover the first electrode plate 45, the gate 41 and the scan line 48. Then the lightly doped silicon layer 442 is formed on the first dielectric layer 441. Then the heavily doped silicon layer 443 is formed on the lightly doped silicon layer 442. Thereafter, the lightly doped silicon layer 442 and the heavily doped silicon layer 443 are patterned using photolithography (including mask formation and exposure) and dry etch. Therefore, the heavily doped silicon layer 443 and the lightly doped silicon layer 442 on the first dielectric layer 441 which is on the gate 41 are remained. Thereafter, the heavily doped silicon layer 443 is patterned to form an opening (not labeled in FIGS. 8b1 and 8b2). The heavily doped silicon layer 443 on two sides of the opening respectively constitute the source and drain. The opening exposes the lightly doped silicon layer 442 which constitutes the conductive channel.

Referring to FIGS. 8c1 and 8c2, performing step e, a second conductive layer is formed to cover the first dielectric layer 441, the remained lightly doped silicon layer 442 and heavily doped silicon layer 443. The second conductive layer may include a material with a luminousness less than 50%. Thereafter, performing step f, the second conductive layer is patterned to form a source electrode 42 electrically coupled to the source, a drain electrode 43 electrically coupled to the drain and a second electrode plate 46. The second electrode plate 46, the first electrode plate 45 and the first dielectric layer on the first electrode plate 45 constitute a capacitor. The second electrode plate 46 is electrically coupled to the source electrode 42 or the drain electrode 43. In some embodiments, when the second conductive layer is patterned, a data line 49 is also formed. In some embodiments, the second electrode plate 46 is electrically coupled to the source electrode and the data line 49 is electrically coupled to the drain electrode. In some embodiments, the second electrode plate 46 is electrically coupled to the drain electrode and the data line 49 is electrically to the source electrode. Detail coupling relationship may be determined based on types of the source and the drain.

The material of the second conductive layer can be selected by referring to above description of the TFT switch. In some embodiments, the second conductive layer may have a stacked structure including a Ti layer, a Al layer and a Ti layer, or a stacked structure including a Al layer and a Mo layer. Or else, the first conductive layer may be a Cr layer, a Mo layer or a Ta layer. The second conductive layer may be formed using chemical vapor deposition or physical vapor deposition.

Referring to FIG. 8d, in some embodiments, after the formation of the TFT switch, a passivation layer 47 is formed using PECVD. The passivation layer 47 may include silicon oxide, silicon nitride, silicon carbide, silicon oxynitride or a combination thereof. Thereafter, the passivation is subject to an exposure with a mask and a dry etch process to be patterned. The patterned passivation layer functions as a protecting film to protect the TFT switch.

The first electrode plate and the gate can be formed in the same step, the second electrode plate, the drain and the source can be formed in the same step, and the capacitor dielectric layer can be formed in the same step with the gate dielectric layer. Therefore, manufacturing process of the TFT switch may be simplified. There is no need to form the capacitor separately with the transistor. Costs may be reduced, production may be accelerated, and efficiency may be increased.

Figure 9:
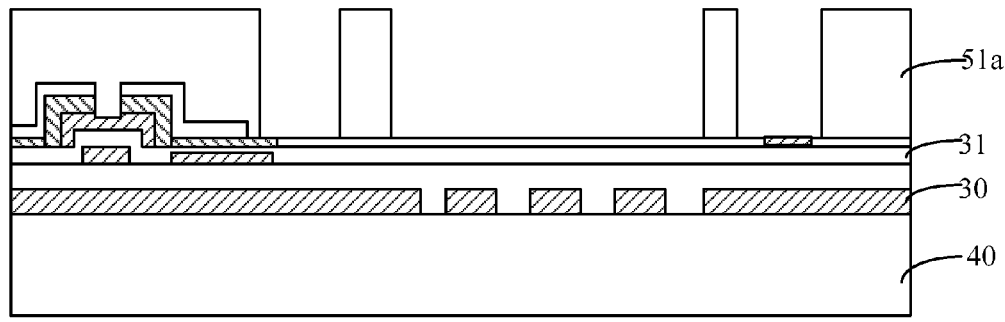
Figure 10:
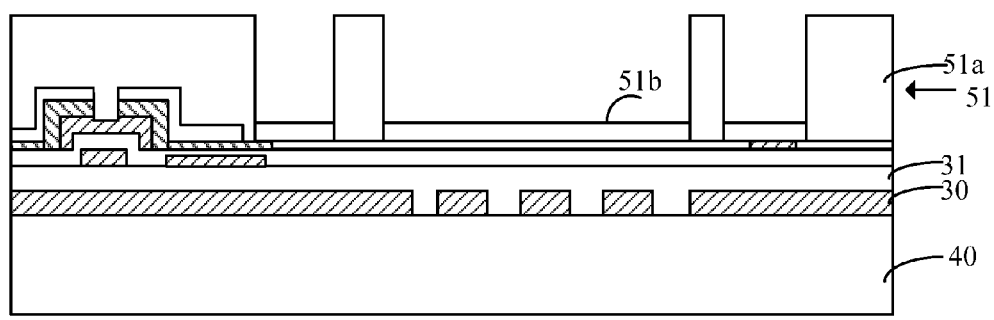

Referring to FIGS. 5, 9 and 10, performing step S13, a patterned first sacrificial layer 51 is formed above the fixed optical grating 30. The patterned first sacrificial layer 51 defines a position of a second MEMS light valve. In some embodiments, the patterned first sacrificial layer 51 is not directly formed on the fixed optical grating 30. The passivation layer 47 is formed between the fixed optical grating 30 and the patterned first sacrificial layer 51.

Referring to FIG. 9, forming the patterned first sacrificial layer 51 ma include: forming a first sacrificial layer above the fixed optical grating 30, which first sacrificial layer covering components above the fixed optical grating 30. In some embodiments, the first sacrificial layer may include amorphous carbon, which may be formed using chemical vapor deposition commonly used in CMOS processes. After the formation of the first sacrificial layer, the first sacrificial layer is patterned using photolithography to form a sacrificial layer 51a with a predefined pattern. Therefore, the position of the second MEMS light valve may be defined. Referring to FIG. 10, after the formation of the sacrificial layer 51a with the predefined pattern, a sacrificial layer 51b with a predefined pattern is formed at positions of the sacrificial layer which is removed. The patterned sacrificial layer 51a and the patterned sacrificial layer 51b together constitute the first sacrificial layer 51. In some embodiments, the predefined sacrificial layer 51b also may include amorphous carbon, which may be formed using chemical vapor deposition commonly used in CMOS processes.

Figure 11:
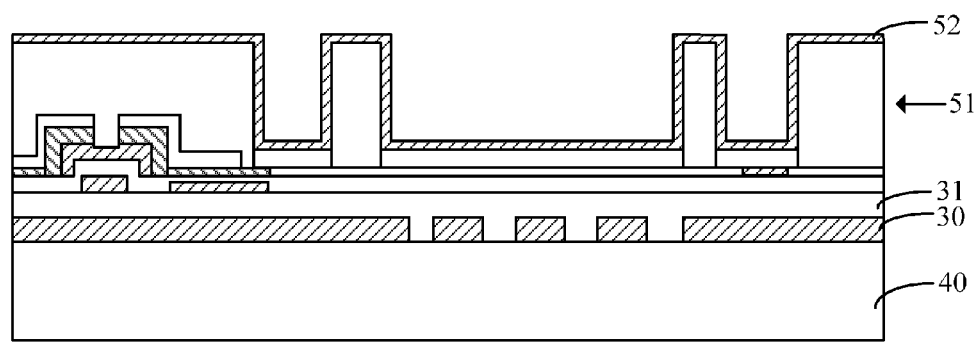
Figure 12:
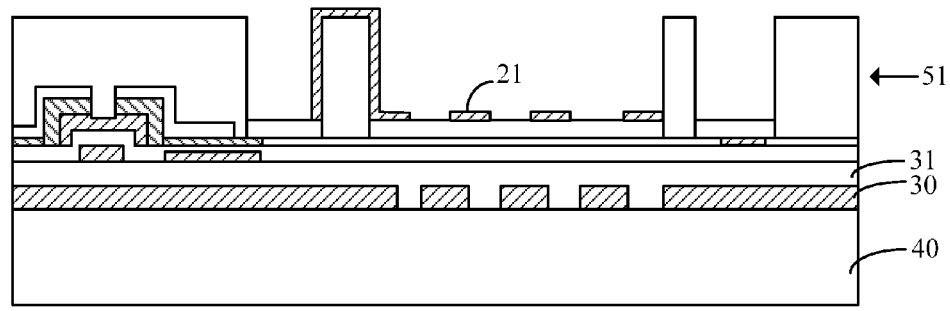

Referring to FIGS. 5, 11 and 12, performing step S14, a third conductive layer 52 and a second dielectric layer (not shown in FIGS. 11 and 12) are successively formed on the first sacrificial layer 51, and the third conductive layer 52 and the second dielectric layer are patterned to form the second movable optical grating and a fixed end of the second movable optical grating. The third conductive layer is etched in an isotropic wet etch process to form the second movable optical grating, in which the third conductive layer corresponding to a third electrode is remained. In some embodiments, a second fixed plate connected with the second movable optical grating is also formed by the etch process.

Referring to FIG. 11, in some embodiments, the third conductive layer 52 may include metal, such as Au, Ag, Cu, Al, Ti, Cr, Mo, Cd, Ni, Co, or a combination thereof. The third conductive layer 52 may include a conductive nonmetal material, such as poly-silicon, amorphous silicon, amorphous silicon germanium, poly-silicon germanium, or the like. The third conductive layer 52 may include a combination of a metal and a conductive nonmetal material. The third conductive layer 52 may be formed using CVD or PVD. In some embodiments, Al is selected. In some embodiments, the second dielectric layer may include silicon oxide, silicon nitride, silicon carbide, silicon oxynitride, or a combination thereof. The second dielectric layer may be formed using chemical vapor deposition. In some embodiments, the second dielectric layer may include silicon oxide. The third conductive layer 52 and the second dielectric layer may be patterned using photolithography and etch processes.

Figure 13:
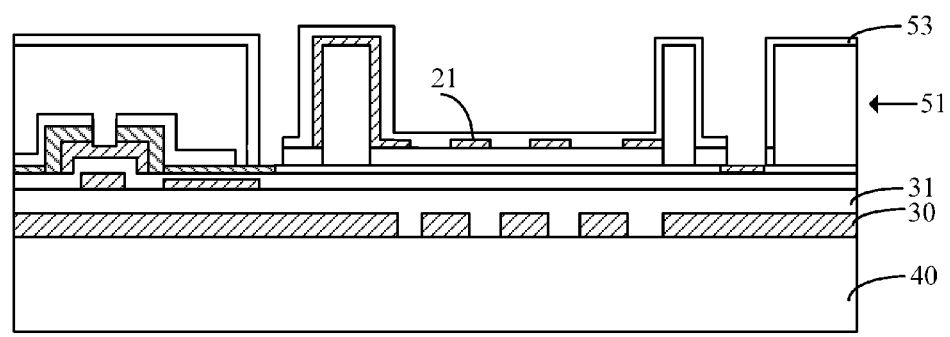

Referring to FIGS. 5 and 13, performing step S15, a patterned second sacrificial layer is formed on the patterned third conductive layer and the patterned second dielectric layer to define a position of a first MEMS light valve. Specifically, a second sacrificial layer may be formed on the second dielectric layer, where the second sacrificial layer 53' may include amorphous carbon and may be formed using a chemical vapor deposition process which is commonly used in CMOS technology. Thereafter, the patterned second sacrificial layer 53 may be formed using photolithography and etch processes.

Referring to FIGS. 5, 14, 15 and 16, performing step S16, a fourth conductive layer 54 and a third dielectric layer (not shown in FIGS. 14, 15 and 16) are successively formed on the second sacrificial layer 53, and the fourth conductive layer 54 and the third dielectric layer are patterned to form the first light valve and the second light valve's third electrode and fourth electrode.

Figure 14:
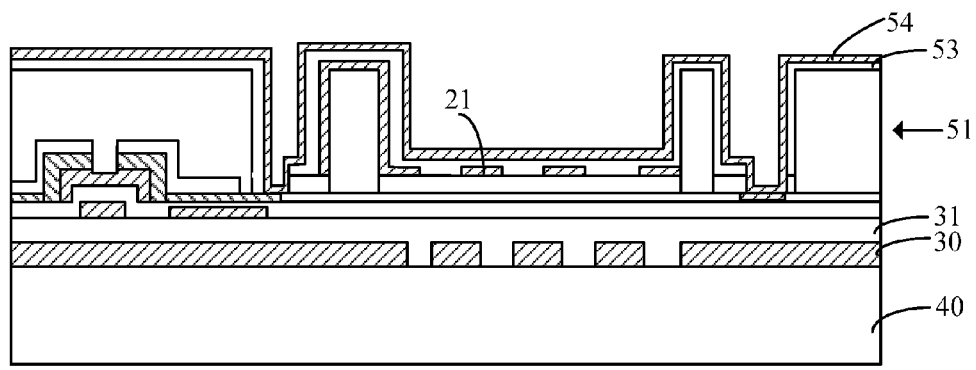

Specifically, referring to FIG. 14, the fourth conductive layer 54 and the third dielectric layer (the third dielectric layer is not shown in FIGS. 14, 15 and 16) are successively formed to cover components formed above the substrate 40, i.e., to cover the first sacrificial layer 51 and the second movable optical grating 21. In some embodiments, the fourth conductive layer 54 may include metal, such as Au, Ag, Cu, Al, Ti, Cr, Mo, Cd, Ni, Co, or a combination thereof. The fourth conductive layer 54 may include a conductive nonmetal material, such as poly-silicon, amorphous silicon, amorphous silicon germanium, poly-silicon germanium, or the like. The fourth conductive layer 54 may include a combination of a metal and a conductive nonmetal material. The fourth conductive layer 54 may be formed using CVD or PVD. In some embodiments, Al is selected. In some embodiments, the third dielectric layer may include silicon oxide, silicon nitride, silicon carbide, silicon oxynitride, or a combination thereof. The third dielectric layer may be formed using chemical vapor deposition. In some embodiments, the third dielectric layer may include silicon oxide. The fourth conductive layer 54 and the third dielectric layer may be patterned using photolithography and etch processes.

Figure 15:
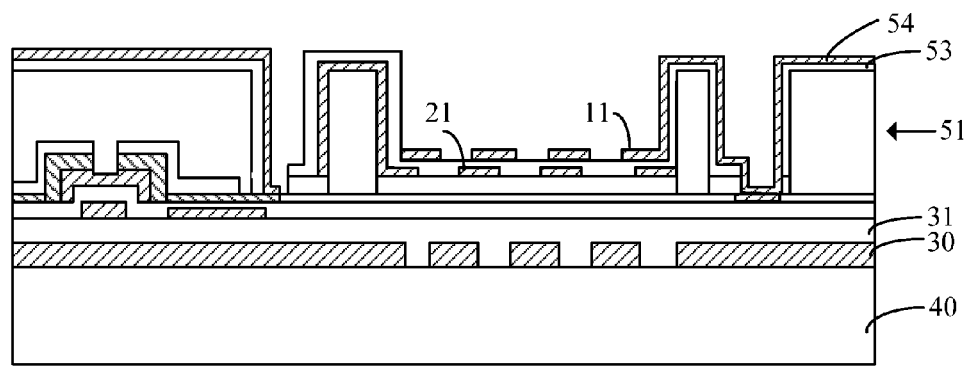
Figure 16:
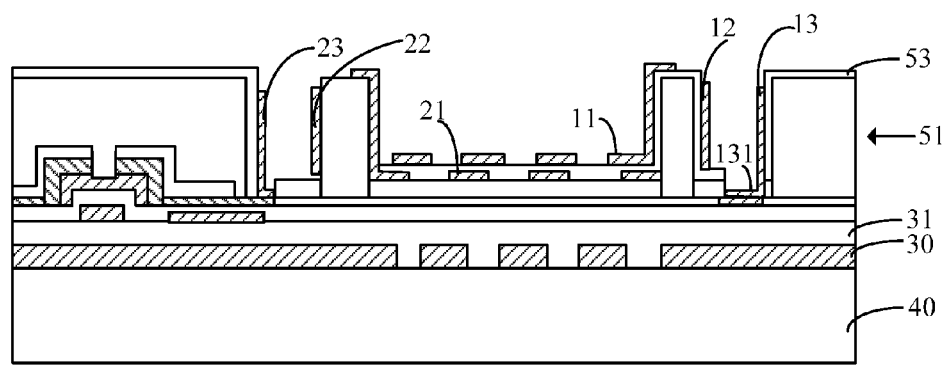

Referring to FIG. 15, the fourth conductive layer 54 and the third dielectric layer are etched in a wet etch process to form the first movable optical grating 11 and a first fixed plate (the first fixed plate is not shown in FIG. 15, please refer to FIG. 1a). Referring to FIG. 16, photoresist is formed on the fourth conductive layer 54 and the third dielectric layer which are etched in the wet etch process. Referring in conjunction with FIG. 1a, the photoresist is patterned to define positions of a first electrode and a second electrode of the first light valve, and positions of the third electrode and a fourth electrode of the second light valve. The fourth conductive layer and the third dielectric layer are then etched in a dry etch process with the patterned photoresist as a mask to form the first electrode 12, the second electrode 13, and the third electrode 22 and the fourth electrode 23 of the second light valve. Thereafter, an ashing process may be performed to remove the patterned photoresist.

Referring to FIGS. 5 and 17-20, performing step S17, the patterned first sacrificial layer and the patterned second sacrificial layer are removed. In some embodiments, before removing the sacrificial layers, the process may further include following steps.

Figure 17:
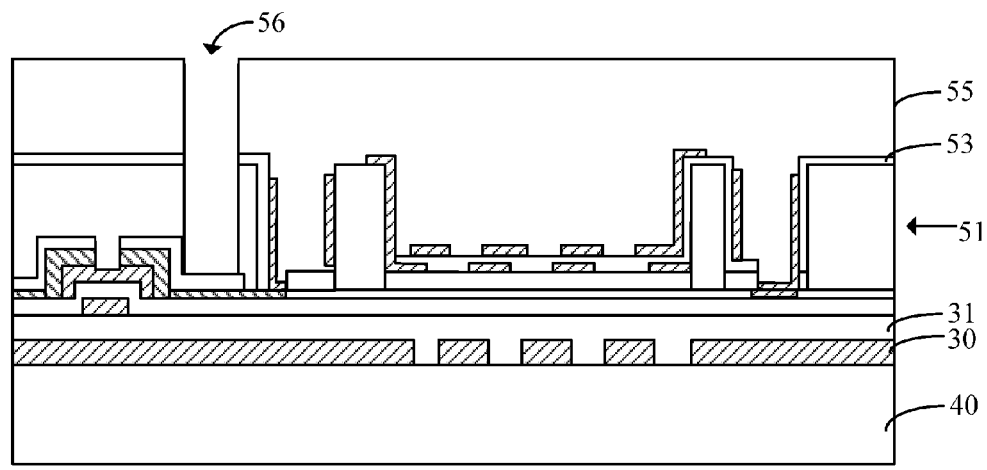

First, referring to FIG. 17, a third sacrificial layer 55 is formed to cover components above the substrate 40. In some embodiments, the third sacrificial layer may include amorphous carbon and may be formed using CVD commonly used in CMOS. After the formation of the third sacrificial layer 55, the process further includes: patterning the third sacrificial layer 55 to form an isolation groove 56 between neighboring MEMS light valves. The isolation groove 56 can isolate the MEMS light valve with other MEMS light valves. The isolation groove 56 may be ring-shaped. Patterning the third sacrificial layer 55 may include common photolithography and etch processes. In some embodiments, forming the isolation groove may be optional.

Figure 18:
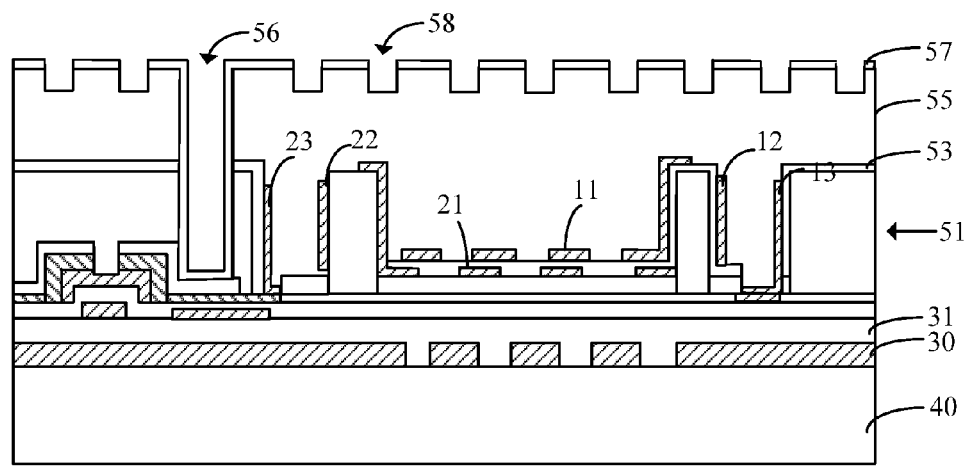

Referring to FIG. 18, a cap layer 57 is formed on the third sacrificial layer 55. The cap layer 57 covers on the top surface and lateral sides of the patterned third sacrificial layer 55. The cap layer 57 includes a plurality of openings 58 which expose the third sacrificial layer 55. The cap layer 57 encompasses the MEMS light valve and covers the top surface of the MEMS light valve. The cap layer 57 includes a top cap 571 and a surrounding cap 572. The surrounding cap 572 is fixed with the substrate 40. The surrounding cap 572 is a surrounding sealing cap, which can protect the MEMS light valves. In some embodiments, the cap layer 57 may include silicon oxide, silicon nitride, silicon carbide or silicon oxynitride. In some embodiments, silicon oxide may be selected. Forming the cap layer 57 may include: forming a silicon oxide layer using CVD to cover the patterned third sacrificial layer 55; and etching the silicon oxide layer using photolithography and etch processes to form the cap layer 57 with the openings 58 which expose the patterned third sacrificial layer 55. The openings 58 have a depth to width ratio ranging from about 0.5 to about 20 and an aperture ranging from about 0.1 micrometers to about 10 micrometers.

Figure 19:
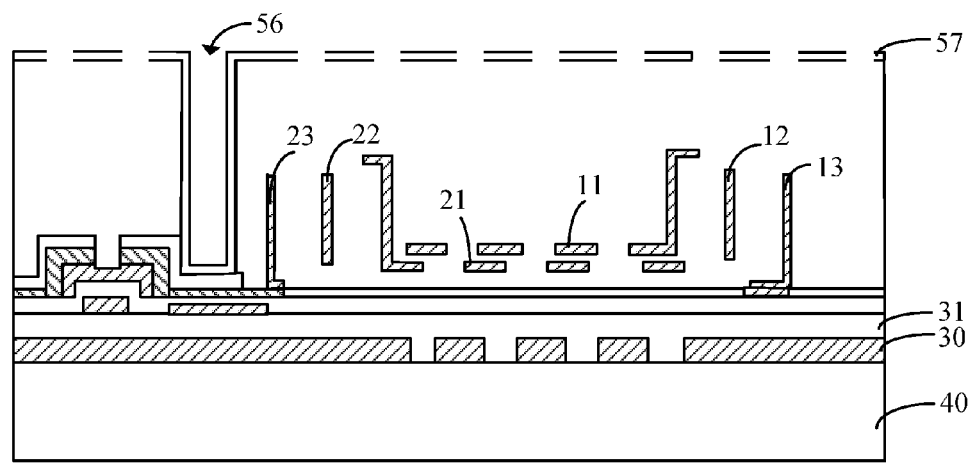

Referring to FIG. 19, after the formation of the cap layer, the patterned first, second and third sacrificial layers are removed, which may include: ionizing oxygen to form oxygen plasma; and inletting the oxygen plasma into the openings to ash the amorphous carbon at a temperature ranging from about 150° C. to about 450° C.

Figure 20:
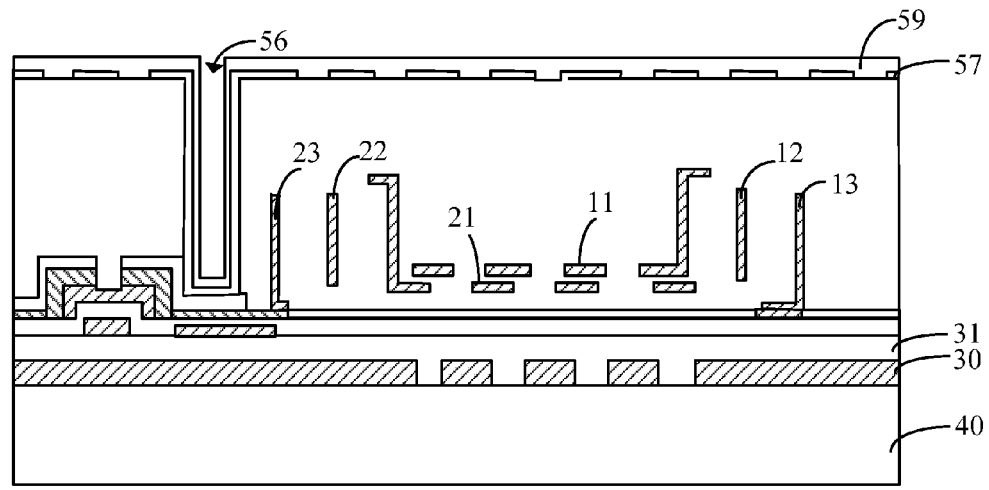

Referring to FIG. 20, in some embodiments, after the display device described above is formed, the process may further include: forming a sealing cap 59 to seal the openings 58. The sealing cap 59 may include silicon oxide, silicon nitride, silicon carbide or silicon oxynitride, and may be formed using CVD. The sealing cap 59 may perform a sealing function to prevent steam, dust, impurities and the like from entering into the display device, thereby increasing the service life of the display device.

In embodiments described above, the fixed optical grating is formed on the substrate before the MEMS light valve is formed above the fixed optical grating. In some embodiments, the MEMS light valve may be formed on the substrate and then the fixed optical grating may be formed on the MEMS light valve. FIG. 21 schematically illustrates a cross-sectional view of a fixed optical grating formed on a MEMS light valve. Referring to FIG. 21, in some embodiments, the MEMS light valve is formed on the substrate 40. The MEMS light valve include a first movable optical grating 11', a first electrode 12', a second electrode 13', a second movable optical grating 21', a third electrode 22' and a fourth electrode 23'. Since the MEMS light valve is preferentially formed, to be corresponding to a fixed optical grating 30' to be formed subsequently, positions of the first movable optical grating 11' and the second movable optical grating 21' may be adjusted corresponding to positions of the first electrode 12', the second electrode 13', the third electrode 22' and the fourth electrode 23'. The first movable optical grating 11' and the second movable optical grating 21' are moved upwardly to be close to the fixed optical grating 30'. Detail components of the MEMS light valve may be conceived by referring to above descriptions, which may not be illustrated here. After the MEMS light valve is formed, a cap layer 57 and a sealing cap 59 are formed, and the fixed optical grating 30' is formed on the sealing cap 59. Specific embodiments regarding such configuration may be easily conceived by those skilled in the art based on above embodiments illustrated in detail. Besides, those skilled in the art can conceive the method for forming such display device based on above descriptions about the formation process. Detail descriptions about such configurations may be omitted here.

Formation of the display device illustrated in FIG. 1a using the method is illustrated in detail. The method is also capable of forming the display devices illustrated in FIGS. 3 and 4, in which suitable masks may need to be adjusted in patterning processes.

Referring to FIGS. 22 and 23, in some embodiments, forming a LTPS-TFT switch may include:

Step 1), forming a silicon layer on the substrate or the fixed optical grating. As shown in FIG. 23, the silicon layer is formed on the fixed optical grating 30. In some embodiments, the MEMS light valve is formed before the fixed optical grating is formed, so the silicon layer is formed on the substrate 40.

Step 2), transforming the silicon layer into a polysilicon layer using crystallization.

Step 3), patterning the polysilicon layer to form a patterned polysilicon layer. Regions for source 61, a drain 61 and a channel 63 are defined. In some embodiments, the channel may be doped in the step to adjust a threshold voltage.

Step 4), forming a gate dielectric layer 64 to cover the patterned polysilicon layer.

Step 5), performing ion implantation to form the source 61 and the drain 62.

Step 6), forming a gate 65 on the gate dielectric layer 64.

Step 7), forming an interlayer dielectric layer (not labeled in figures) to cover the gate dielectric layer 64 and the gate 65. The interlayer dielectric layer may include silicon oxide.

Step 8), forming, in the gate dielectric layer 64 and the interlayer dielectric layer, a first conductive plug (not labeled in figures) electrically coupled to the source 61 and a second plug (not labeled in figures) electrically coupled to the drain 62. Formations of the first and second conductive plugs are well known in the art.

Step 9), forming a source electrode 66 on the first conductive plug and a drain electrode 67 on the second conductive plug.

Step 10), forming a patterned passivation layer on the interlayer dielectric layer, the first and second conductive plugs. The patterned passivation layer includes an opening which exposes the source electrode 67.

Step 11), successively forming a first conductive layer, a dielectric layer and a second conductive layer on the patterned passivation layer and the opening. The first and second conductive layers may include a material which is opaque. The first and second conductive layers may include Au, Ag, Cu, Al, Ti, Cr, Mo, Cd, Ni, Co, poly-silicon, amorphous silicon, amorphous silicon germanium, poly-silicon germanium, or a combination thereof. The first and second conductive layers may be formed using vapor deposition. The dielectric layer may include silicon oxide, silicon nitride, silicon carbide, silicon oxynitride, or a combination thereof, and may be formed using CVD.

Step 12), patterning the first conductive layer, the dielectric layer and the second conductive layer to form a first electrode plate, a capacitor dielectric layer and a second electrode plate. The first conductive layer is patterned to form the first electrode plate. The second conductive layer is patterned to form the second electrode plate. The dielectric layer is patterned to form the capacitor dielectric layer.

After the formation of the LTPS-TFT switch, a MEMS light valve, a cap layer and a sealing cap may be formed using the method described above.

The MEMS light valve of the present disclosure includes a first light valve and a second light valve. By controlling the movements of the first light valve and the second light valve, the fixed optical grating could be controlled to be opaque or nonopaque conveniently. Compared with a device which only has one light valve, sensitivity of the MEMS light valve of the present disclosure may be increased.

In some embodiments, the first light valve includes: a first movable optical grating, a first electrode and a second electrode. When an electric potential difference exists between the first electrode and the second electrode, the first electrode can drive the first movable optical grating to move. The second light valve includes: a second movable optical grating, a third electrode and a fourth electrode. When an electric potential difference exists between the third electrode and the fourth electrode, the third electrode can drive the second movable optical grating to move. The movement directions of the first movable optical grating and the second movable optical grating are opposite to each other. Besides, both the first light valve and the second light valve have fixed ends to connect the first light valve and the second light valve with the substrate. When the light valves are required to return to their original positions, the electric potential differences between the first and second electrodes, and between the third and fourth electrodes, may be released. As such, the fixed ends of the first light valve and the second light valve may drive them to the original positions, respectively. Therefore, the movement of the first light valve can be controlled by adjusting the electric potential difference between the first and second electrodes, and the movement of the second light valve can be controlled by adjusting the electric potential difference between the third and fourth electrodes. The MEMS light valve may be controlled conveniently, and its structure is relatively simple.

Besides, in some embodiments, the TFT switch has the first electrode plate, the second electrode and the capacitor dielectric layer therebetween constituting its capacitor. The first electrode plate and the gate are in the same layer and have the same material which is a conductive material with a luminousness less than about 50%. The second electrode plate, the source and the drain are in the same layer and have the same material which is a conductive material with a luminousness less than about 50%. When the MEMS light valve is used in the display device, since the MEMS light valve doesn't need a relatively large opening rate, the TFT switch can be disposed in the display device at a position which is not used to let light through. Further, the first electrode plate, the second electrode plate, the gate, the source and the drain all have a conductive material with a luminousness less than about 50%, so that the TFT switch can be better compatible with the MEMS light valve, which may improve the device performance. During formation of a TFT switch with such structure, the first electrode plate and the gate can be formed in the same step, the second electrode plate, the drain and the source can be formed in the same step, and the capacitor dielectric layer can be formed in the same step with the gate dielectric layer. Therefore, manufacturing process of the TFT switch may be simplified. There is no need to form the capacitor separately with the transistor. Costs may be reduced, production may be accelerated, and efficiency may be increased.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A display device with a micro-electromechanical system (MEMS) light valve, comprising:
    a substrate; and
    a fixed optical grating and a MEMS light valve above the substrate, wherein the MEMS light valve is used to control the fixed optical grating to open or close;
    wherein the MEMS light valve comprises a first light valve and a second light valve, the first light valve is formed on the second light valve, the fixed optical grating is configured to be opened or closed by controlling movements of the first light valve and the second light valve, and movement directions of the first light valve and the second light valve are opposite;
    wherein the first light value comprises a first movable optical grating, a first electrode and, a second electrode;
    wherein the first movable optical grating is fixed to and electrically coupled with the first electrode which is disposed correspondingly with the second electrode, a capacitor is formed between the first electrode and the second electrode, and when an electric potential difference exists between the first electrode and the second electrode, the first electrode is configured to drive the first movable optical grating to move; and wherein a fixed end is provided on a side of the first movable optical grating which is opposite to the first electrode, the first movable optical grating is fixed to the fixed end, and when there is no electric potential difference existing between the first electrode and the second electrode, the fixed end is configured to drive the first movable optical grating to return to an original position.

2. The display device according to claim 1, wherein the second light valve comprises: a second movable optical grating, a third electrode, and a fourth electrode, wherein the third electrode and the fourth electrode are disposed on a side of the second movable optical grating, which side is opposite to a side on which the first electrode and the second electrode are located;

wherein the second movable optical grating is fixed to and electrically coupled with the third electrode which is disposed correspondingly with the fourth electrode, a capacitor is formed between the third electrode and the fourth electrode, and when an electric potential difference exists between the third electrode and the fourth electrode, the third electrode is configured to drive the second movable optical grating to move; and wherein a fixed end is provided on a side of the second movable optical grating which is opposite to the third electrode, the second movable optical grating is fixed to the fixed end of the second movable optical grating, and when there is no electric potential difference existing between the third electrode and the fourth electrode, the fixed end is configured to drive the second movable optical grating to return to an original position.

3. The display device according to claim 2, wherein the fixed optical grating has a rectangle shape with a top side, a bottom side and two lateral sides;

wherein each of the first movable optical grating and the second movable optical grating has a rectangle shape with a first side, a second side, a third side and a fourth side, the first side is opposite to the third side, the second side is opposite to the fourth side, the first side is corresponding to the top side of the fixed optical grating, the third side is corresponding to the bottom side of the fixed optical grating, and the second side and the fourth side are respectively corresponding to the two lateral sides of the fixed optical grating;

wherein the first electrode and the second electrode are disposed on a side where the second side of the first movable optical grating locates, and the fixed end of the first movable optical grating is disposed on a side where the fourth side of the first movable optical grating locates; and wherein the third electrode and the fourth electrode are disposed on a side where the fourth side of the second movable optical grating locates, and the fixed end of the second movable optical grating is disposed on a side where the second side of the second movable optical grating locates.

4. The display device according to claim 3, wherein the first light valve further comprises a first fixed plate which is disposed on a side where the fourth side of the first movable optical grating locates and fixed to the first movable optical grating, the first fixed plate comprises two plates which are symmetrically disposed on the fourth side of the first movable optical grating and respectively extend beyond the first side and the third side of the first movable optical grating, the fixed end of the first movable optical grating is disposed at ends of the two plates of the first fixed plate which are apart from the first movable optical grating; and wherein the second light valve further comprises a second fixed plates which is disposed on a side where the second side of the second movable optical grating locates and fixed to the second movable optical grating, the second fixed plate comprises two plates which are symmetrically disposed on a side where the second side of the second movable optical grating locates and respectively extend beyond the first side and the third side of the second movable optical grating, the fixed end of the second movable optical grating is disposed at ends of the two plates of the second fixed plate which are apart from the second movable optical grating.

5. The display device according to claim 3, wherein the first electrode comprises a first plate and a second plate, the first plate and the second plate are connected with the first movable optical grating and symmetrically disposed, ends of the first plate and the second plate which are apart from the first movable optical grating are first fixed ends, and the first electrode is fixed by the first fixed ends; and wherein the second electrode comprises a third plate and a fourth plate, the third plate is opposite to the first plate of the first electrode, the fourth plate is opposite to the second plate of the first electrode, a second fixed end is provided between the third plate and the fourth plate, the second fixed end connects the third plate with the fourth plate, the second electrode is fixed by the second fixed end, and a distance between each of two lateral ends of the second electrode and the first electrode is less than a distance between the second fixed end and the first electrode.

6. The display device according to claim 3, wherein each of the first movable optical grating and the second movable optical grating comprises a plurality of strip-shaped nonopaque openings, the strip-shaped nonopaque openings of the first movable optical grating and the second movable optical grating are parallel with the second sides of the first movable optical grating and the second movable optical grating, respectively.

7. The display device according to claim 2, wherein the fixed optical grating is circular and comprises a plurality of fan-shaped nonopaque openings, and each of the first movable optical grating and the second movable optical grating is circular and comprises a plurality of fan-shaped nonopaque openings;

wherein the first electrode, the second electrode and the fixed end of the first movable optical grating are disposed on a circumference edge of the first movable optical grating; and wherein the third electrode, the fourth electrode and the fixed end of the second movable optical grating are disposed on a circumference edge of the second movable optical grating.

8. The display device according to claim 7, wherein the first electrode comprises a first plate which is connected to the circumference edge of the first movable optical grating, an end of the first plate which is apart from the first movable optical grating is a first fixed end, and the first electrode is fixed by the first fixed end;

the second electrode comprises a second plate which is opposite to the first plate of the first electrode, the second plate comprises a second fixed end, the second electrode is fixed by the second fixed end, a distance between an end of the second plate which is apart from the second fixed end and the first electrode is less than a distance between the second fixed end and the first electrode;

the third electrode comprises a third plate which is connected to the circumference edge of the second movable optical grating, an end of the third plate which is apart from the second movable optical grating is a third fixed end, and the third electrode is fixed by the third fixed end; and the fourth electrode comprises a fourth plate which is opposite to the third plate of the third electrode, the fourth plate comprises a fourth fixed end, the fourth electrode is fixed by the fourth fixed end, a distance between an end of the fourth plate which is apart from the fourth fixed end and the third electrode is less than a distance between the fourth fixed end and the third electrode.

9. The display device according to claim 8, wherein the first light valve further comprises a first fixed plate which is disposed on the circumference edge of the circular first movable optical grating and fixed to the first movable optical grating, the fixed end of the first movable optical grating is disposed at an end of the first fixed plate which is apart from the first movable optical grating; and the second light valve further comprises a second fixed plate which is disposed on the circumference edge of the circular second movable optical grating and fixed to the second movable optical grating, the fixed end of the second movable optical grating is disposed at an end of the second fixed plate which is apart from the second movable optical grating.

10. The display device according to claim 2, wherein the fixed optical grating is fan-shaped and comprises a plurality of strip-shaped nonopaque openings, and each of the first movable optical grating and the second movable optical grating is fan-shaped and comprises a plurality of strip-shaped nonopaque openings;

wherein the first electrode and the second electrode are disposed on a shorter arc side of the first movable optical grating, and the fixed end of the first movable optical grating is disposed on a longer arc side of the first movable optical grating; and wherein the third electrode and the fourth electrode are disposed on a shorter arc side of the second movable optical grating, and the fixed end of the second movable optical grating is disposed on a longer arc side of the second movable optical grating.

11. The display device according to claim 10, wherein the first electrode comprises a first plate which is connected to the shorter arc side of the first movable optical grating, an end of the first plate which is apart from the first movable optical grating is a first fixed end, and the first electrode is fixed by the first fixed end;

the second electrode comprises a second plate which is opposite to the first plate of the first electrode, the second plate comprises a second fixed end, the second electrode is fixed by the second fixed end, a distance between an end of the second plate which is apart from the second fixed end and the first electrode is less than a distance between the second fixed end and the first electrode;

the third electrode comprises a third plate which is connected to the shorter arc side of the second movable optical grating, an end of the third plate which is apart from the second movable optical grating is a third fixed end, and the third electrode is fixed by the third fixed end; and the fourth electrode comprises a fourth plate which is opposite to the third plate of the third electrode, the fourth plate comprises a fourth fixed end, the fourth electrode is fixed by the fourth fixed end, a distance between an end of the fourth plate which is apart from the fourth fixed end and the third electrode is less than a distance between the fourth fixed end and the third electrode.

12. The display device according to claim 11, wherein the first light valve further comprises a first fixed plate which is disposed on the longer arc side of the first movable optical grating and fixed to the first movable optical grating, the fixed end of the first movable optical grating is disposed at an end of the first fixed plate which is apart from the first movable optical grating; and the second light valve further comprises a second fixed plate which is disposed on the longer arc side of the second movable optical grating and fixed to the second movable optical grating, the fixed end of the second movable optical grating is disposed at an end of the second fixed plate which is apart from the second movable optical grating.

13. The display device according to claim 2, further comprising a plurality of thin-film-transistor (TFT) switches on the substrate or the fixed optical grating, wherein each of the first, second, third and fourth electrodes is electrically coupled to a corresponding TFT switches, respectively.

14. The display device according to claim 13, wherein each of the TFT switches comprises:

a gate, a source, a drain, a conductive channel for electrically coupling the source and the drain, a gate dielectric layer between the conductive channel and the gate, a source electrode electrically coupled to the source, a drain electrode electrically coupled to the drain, and a capacitor comprising a first electrode plate, a second electrode plate and a capacitor dielectric layer between the first electrode plate and the second electrode plate, wherein the first electrode plate and the gate are disposed in a same layer and comprise a same conductive material having a luminousness less than about 50%, wherein the second electrode plate, the source electrode and the drain electrode are in a same layer and comprise a same conductive material having a luminousness less than about 50%, the second electrode plate is electrically coupled to the source electrode or the drain electrode, and the second electrode plate is electrically coupled to any one of the first, second, third and fourth electrodes.

15. The display device according to claim 14, wherein the gate dielectric layer and the capacitor dielectric layer comprise a same material and are disposed in a same layer.

16. A method for forming a display device with a microelectromechanical system (MEMS) light valve, comprising:

providing a substrate; and forming a fixed optical grating and a MEMS light valve according to claim 2 above the substrate, wherein the MEMS light valve is formed on the fixed optical grating after the fixed optical grating is formed on the substrate, or, the fixed optical grating is formed on the MEMS light valve after the MEMS light valve is formed on the substrate.

17. The method according to claim 16, wherein a plurality of thin-film-transistor (TFT) switches are formed on the substrate or the fixed optical grating before the MEMS light valve is formed, wherein the first, second, third and fourth electrodes are electrically coupled to the TFT switches, respectively.

18. The method according to claim 17, wherein forming each one of the TFT switches comprises:
- forming a first conductive layer on the substrate or the fixed optical grating, wherein the first conductive layer comprises a conductive material having a luminousness less than about 50%;
- patterning the first conductive layer to form a gate and a first electrode plate;
- forming a first dielectric layer to cover the gate and the first electrode plate, wherein a part of the first dielectric layer on the first electrode plate constitutes a capacitor dielectric layer, and a part of the first dielectric layer on the gate constitutes a gate dielectric layer;
- successively forming a lightly doped silicon layer and a heavily doped silicon layer on the part of the first dielectric layer which is on the gate, wherein the heavily doped silicon layer comprises an opening which exposes the lightly doped silicon layer, two parts of the heavily doped silicon layer on two sides of the opening constitute a source and a drain, respectively, and the lightly doped silicon layer constitutes a conductive channel;
- forming a second conductive layer to cover the first dielectric layer, the lightly doped silicon layer and the heavily doped silicon layer, wherein the second conductive layer comprises a conductive material with a luminousness less than about 50%; and
- patterning the second conductive layer to form a source electrode electrically coupled to the source, a drain electrode electrically coupled to the drain, and a second electrode plate, wherein the second electrode plate, the first electrode plate and the part of the first dielectric layer on the first electrode plate constitute a capacitor, and the second electrode plate is electrically coupled to the source electrode or the drain electrode.

19. The method according to claim 18, wherein the MEMS light valve is formed after the TFT switches are formed, and forming the MEMS light valve comprises:
- forming a patterned first sacrificial layer on the substrate or the fixed optical grating, wherein the patterned first sacrificial layer defines a position of the second light valve;
- forming a third conductive layer and a second dielectric layer successively on the patterned first sacrificial layer, and patterning the third conductive layer and the second dielectric layer to form the second movable optical grating and the fixed end of the second movable optical grating;
- forming a patterned second sacrificial layer on the patterned third conductive layer and the patterned second dielectric layer, wherein the patterned second sacrificial layer defines a position of a first MEMS light valve;
- forming a fourth conductive layer and a third dielectric layer successively on the patterned second sacrificial layer, and patterning the fourth conductive layer and the third dielectric layer to form the first light valve, and the third electrode and fourth electrode of a second MEMS light valve; and
- removing the patterned first sacrificial layer and the patterned second sacrificial layer.

* * * * *